(12) United States Patent
Gomez

(10) Patent No.: US 7,449,963 B2
(45) Date of Patent: *Nov. 11, 2008

(54) APPARATUS AND METHOD FOR PHASE LOCK GAIN CONTROL USING UNIT CURRENT SOURCES

(75) Inventor: Ramon A. Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 11/754,804

(22) Filed: May 29, 2007

(65) Prior Publication Data

US 2007/0268076 A1    Nov. 22, 2007

Related U.S. Application Data

(63) Continuation of application No. 11/314,618, filed on Dec. 21, 2005, now Pat. No. 7,224,234, which is a continuation of application No. 11/096,154, filed on Mar. 30, 2005, now Pat. No. 7,119,624, which is a continuation of application No. 11/019,451, filed on Dec. 23, 2004, now Pat. No. 7,129,792, which is a continuation of application No. 10/443,741, filed on May 23, 2003, now Pat. No. 6,838,947, which is a continuation of application No. 09/811,611, filed on Mar. 20, 2001, now Pat. No. 6,583,675, said application No. 11/314,618 is a continuation of application No. 11/019,451, filed on Dec. 23, 2004, now Pat. No. 7,129,792, which is a continuation of application No. 10/443,741, filed on May 23, 2003, now Pat. No. 6,838,947, which is a continuation of application No. 09/811,611, filed on Mar. 20, 2001, now Pat. No. 6,583,675.

(51) Int. Cl.
*H03L 7/00* (2006.01)

(52) U.S. Cl. ......................... 331/17; 331/16

(58) Field of Classification Search .............. 331/2, 331/16, 17, 117 R
See application file for complete search history.

(56) References Cited

U.S. PATENT DOCUMENTS 3,526,859 A    9/1970    Putzer (Continued)

FOREIGN PATENT DOCUMENTS

| EP | 0627820 | 12/1994 |
|----|---------|---------|
| EP | 0642227 | 3/1995  |
| EP | 1075086 | 2/2001  |

OTHER PUBLICATIONS

Crawford, J.A., "Frequency Synthesizer Design Handbook," Artech House, pp. 248-254 and 292-304 (1994).

(Continued)

*Primary Examiner*—Joseph Chang
(74) *Attorney, Agent, or Firm*—McAndrews, Held & Malloy, Ltd.

(57) ABSTRACT

A gain compensator compensates for the gain variation of a varactor-tuned voltage tuned oscillator (VCO) in a phase lock loop (PLL). The VCO includes a parallel LC circuit having multiple fixed capacitors that can be switched-in or switched-out of the LC circuit according to a capacitor control signal to perform band-select tuning of the VCO. The gain compensator compensates for the variable VCO gain by generating a charge pump reference current that is based on the same capacitor control signal that controls the fixed capacitors in the LC circuit. The gain compensator generates the charge pump reference current by replicating a reference scale current using unit current sources. The number of times the reference scale current is replicated is based on the fixed capacitance that is switched-in to the LC circuit and therefore the frequency band of the PLL. The reference scale current is generated based on a PLL control that specifies certain PLL characteristics such as reference frequency, loop bandwidth, and loop damping. Therefore, the reference pump current can be efficiently optimized for-changing PLL operating conditions, in addition to compensating for variable VCO gain.

20 Claims, 13 Drawing Sheets

U.S. PATENT DOCUMENTS

| | | | |
|---|---|---|---|
| 3,538,450 | A | 11/1970 | Andrea et al. |
| 4,568,888 | A | 2/1986 | Kimura et al. |
| 4,970,472 | A | 11/1990 | Kennedy et al. |
| 5,030,926 | A | 7/1991 | Walden |
| 5,126,692 | A | 6/1992 | Shearer et al. |
| 5,254,958 | A | 10/1993 | Flach et al. |
| 5,315,270 | A | 5/1994 | Leonowich |
| 5,362,990 | A | 11/1994 | Alvarez et al. |
| 5,369,376 | A | 11/1994 | Leblebiocioglu |
| 5,485,125 | A | 1/1996 | Dufour |
| 5,563,553 | A | 10/1996 | Jackson |
| 5,625,325 | A | 4/1997 | Rotzoll et al. |
| 5,648,744 | A | 7/1997 | Prakash et al. |
| 5,739,730 | A | 4/1998 | Rotzoll |
| 5,783,972 | A | 7/1998 | Nishikawa |
| 5,821,818 | A | 10/1998 | Idei et al. |
| 6,028,488 | A | 2/2000 | Landman et al. |
| 6,091,304 | A | 7/2000 | Harrer |
| 6,133,797 | A | 10/2000 | Lovelace et al. |
| 6,137,372 | A | 10/2000 | Weland |
| 6,163,184 | A | 12/2000 | Larsson |
| 6,211,745 | B1 | 4/2001 | Mucke et al. |
| 6,285,263 | B1 | 9/2001 | Anderson |
| 6,445,627 | B1 | 9/2002 | Nakahara et al. |
| 6,583,675 | B2 | 6/2003 | Gomez |
| 6,838,947 | B2 | 1/2005 | Gomez |

OTHER PUBLICATIONS

Rohde, U.L., "Digital PLL Frequency Synthesizers," Prentice-Hall, pp. 55-58 (1983).
European Search Report issued Jun. 6, 2002, for EP 02252014, 3 pp.
An original executed Declaration of Ramon A. Gomez.
Press Release, "Broadcom Delivers World's First CMOS TV Tuner," 5 pp. Dec. 6, 1999.
Respondent Qualcomm Incorporated Notice of Prior Art, with Exhibit C attached thereto, Nov. 2005.
Qualcomm's Response to Interrogatory 3.
Abidi et al., "Power-Conscious Design of Wireless Circuits and Systems", IEEE Proceedings, Oct. 2000, vol. 88, No. 10, pp. 1528-1545.
Alvarez et al., "A Wide-Bandwidth Low-Voltage PLL For Power Pcä Microprocessors", 1994 Symposium On VLSI Circuits Digest of Technical Papers, Apr. 1995, vol. 30, No. 4, pp. 384-391.
Alvarez et al., "A Wide-Bandwidth Low-Voltage PLL For Power Pcä Microprocessors", 1994 Symposium On VLSI Circuits Digest of Technical Papers, Jun. 9-11, 1994, Sec. 4.2, pp. 37-38.
Bayer et al., "A Low Noise CMOS Frequency Synthesizer With Dynamic Bandwidth Control", IEEE 1994 Custom Integrated Circuits Conference, May 1-4, 1994, Sec. 8.5.1, pp. 171-174.
Boerstler, "A Low-Jitter PLL Clock Generator For Microprocessors With Lock Range Of 340-612 MHz", IEEE J. Of Solid State Circuits, Apr. 1999, vol. 34, No. 4, p. 513-519.
Craninckx et al., "A Fully Integrated CMOS DCS-1800 Frequency Synthesizer", IEEE International Solid State Circuits Conference '98 Proceedings, Feb. 17, 1998, pp. 372-373, 466.
Craninckx et al., "A Fully Integrated CMOS DCS-1800 Frequency Synthesizer", IEEE J. of Solid State Circuits, Dec. 1998, vol. 33, No. 12, pp. 2054-2065.
Diorio et al., "A Low-Noise GaAs/AlGaAs, Microwave Frequency-Synthesizer IC", IEEE J. of Solid State Circuits Sep. 1998, vol. 33, No. 9, pp. 1306-1312.
Gardner, "Charge-Pump Phase-Lock Loops," IEEE Trans. On. Comms., Nov. 1980, vol. COM-28, No. 11, pp. 1849-1858.
Kelkar et al., "A Wide-Range Low-Hitter Fully Integrated Programmable Frequency Synthesizer Building Block in A 1.5V/0.25 um DMOS Process", IEEE Int'l. ASIC/SOC Conference Proceedings, Sep. 15, 1999-Sep. 18, 1999, pp. 357-361.
Lam et al., "A 2.6-GHz/5.2GHz Frequency Synthesizer in 0.4 um CMOS Technology", IEEE J. Of Solid State Circuits, May 2000. pp. 551-557.
Larsson, "A 2-1600-MHz CMOS Clock Recovery PLL With Low-Vdd Capability", IEEE J. Of Solid State Circuits, Dec. 1999, vol. 34, No. 12, pp. 1951-1960.
Lin et al., A 900MHz, 2.5mA CMOS Frequency Synthesizer With An Automatic SC Tuning Loop, Proceedings Of Custom Integrated Circuits Conference; May 2000, pp. 375-378.
Lo et al., "A 1.5-V 900MHz Monolithic CMOS Fast-Switching Frequency Synthesizer for Wireless Applications", Symposium On VLSI Circuits Digest of Technical Papers, Jun. 2000, pp. 238-241.
Razavi, "Monolithic Phase-Locked Loops And Clock Recovery Circuits, Theory and Design", IEEE, 1996, pp. 1-498.
Roh et al, "Optimum Phase-Acquisition Technique For Charge-Pump PLL", IEEE Transactions On Circuits And Systems-II: Analog and Digital Signal Processing, Sep. 1997, vol. 44, No. 9, pp. 729-740.
Rhode, "Digital PLL Frequency Synthesizers Theory and Design", Prentice Hall, 1993.
Sun et al., "A Fully Integrated Dual-Frequency Push-Push VCO For Wideband Wireless Applications," Proc. Of Gallium Arsenide Applications Symposium, Oct. 2-6, 2000.
Sun, "An Analog PLL-Based Clock And Data Recovery Circuit With High Input Jitter Tolerance", IEEE J. Of Solid-State Circuits, Apr. 1989, vol. 24, No. 2, pp. 325-330.
Tournier, "A New Tuning And Display Monochip For Radio Bands Emitters And Receivers", IEEE, 1988.
Wolaver, "Phase-Locked Loop Circuit Design", Prentice Hall, 1991.
Yang, "A Low Jitter 0.3-165 MHz CMOS PLL Frequency Synthesizer For 3 V/5 V Operation", IEEE J. Of Solid State Circuits, Apr. 1997, vol. 32, No. 4, pp. 582-586.
"DS8908B AM/FM Digital Phase-Locked Loop Frequency Synthesizer", National Semiconductor, Jun. 1990, pp. 1-10.
Byrd et al., "A Fast Locking Scheme for PLL, Frequency Synthesizers", National Semiconductor App. Note 1000, Jul. 1995.
Notice Regarding Issuance Of Initial Determination And Recommended Determination On Remedy And Bond, Oct. 10, 2006.
Kishine et al., "A 2.5 Gb/s Clock And Data Recovery IC With Tunable Jitter Characteristics For Use In LAN's And WAN's", IEEE J. of Solid-State Circuits, Jun. 1999, vol. 34, No. 6, pp. 805-812.
Kral et al., "RF-CMOS Oscillators With Switched Tuning", Custom IC Conference, Santa Clara, CA, May 1998, pp. 555-558.
Kral, "A 2.4 GHz CMOS Frequency Synthesizer", Final Report, UCLA Integrated Circuits And Systems Laboratory, Mar. 1998.
Best, "Phase-Locked Loops, Design, Simulations And Applications" (McGraw-Hill), 1997.
Gray et al., "Analysis And Design Of Analog Integrated Circuits", Wiley 2nd Ed., 1984.
Posthearing Brief Of The Commission Investigative Staff, United States International Trade Commission, Apr. 3, 2006.
Craninckx et al., Wireless CMOS Frequency Synthesizer Design, 1998.
Invalidity Expert Report Of German Gutierrez, 12/05/206.
Rebuttal Expert Report Of Linda Milor, Ph.D., Regarding Validity of U.S. Patent No. 6,583,675, Dec. 14, 2005.

APPARATUS AND METHOD FOR PHASE LOCK GAIN CONTROL USING UNIT CURRENT SOURCES

CROSS-REFERENCE TO RELATED APPLICATIONS

This application is a continuation of U.S. application Ser. No. 11/314,618, filed Dec. 21, 2005, which is a continuation of U.S. application Ser. No. 11/096,154, filed Mar. 30, 2005 (now issued U.S. Pat. No. 7,119,624), which is a continuation of U.S. application Ser. No. 11/019,451, filed Dec. 23, 2004 (now issued U.S. Pat. No. 7,129,792), which is a continuation of U.S. application Ser. No. 10/443,741, filed May 23, 2003 (now issued U.S. Pat. No. 6,838,947 B2), which is a continuation of U.S. application Ser. No. 09/811,611, filed Mar. 20, 2001 (now issued U.S. Pat. No. 6,583,675 B2).

U.S. application Ser. No. 11/314,618, filed Dec. 21, 2005 is also a continuation of U.S. application Ser. No. 11/019,451, filed Dec. 23, 2004 (now issued U.S. Pat. No. 7,129,792), which is a continuation of U.S. application Ser. No. 10/443, 741, filed May 23, 2003 (now issued U.S. Pat. No. 6,838,947 B2), which is a continuation of U.S. application Ser. No. 09/811,611, filed Mar. 20, 2001 (now issued U.S. Pat. No. 6,583,675B2).

The above-identified applications are hereby incorporated herein by reference in their entirety.

BACKGROUND OF THE INVENTION

1. Field of the Invention

The present invention generally relates to gain control in a phase lock loop, and more specifically to phase lock loop gain control using scaled unit current sources.

2. Background Art

Radio frequency (RF) transmitters and receivers perform frequency translation by mixing an input signal with a local oscillator (LO) signal. Preferably, the LO signal should have a frequency spectrum that is as close to a pure tone as possible in order to maximize system performance during the signal mixing operation. The deviation of the LO signal from a pure tone is quantified as phase noise or phase jitter, and is generally referred to as spectral purity. In other words, a LO signal with good spectral purity has low phase noise.

Phase-locked loops (PLLs) are often used in frequency synthesizers to generate the LO signal. A PLL frequency synthesizer produces an output signal, typically a sinewave or square wave, that is a frequency multiple of an input reference signal. The PLL output signal is also in phase synchronization with the input reference signal. PLLs are feedback loops, and therefore are susceptible to instability. Therefore, loop stability is a key performance parameter for PLLs, in addition to spectral purity of the output signal.

A resonant-tuned voltage controlled oscillator (VCO) is typically utilized in a PLL to generate the PLL output signal. A resonant tuned VCO includes an active device and a resonant LC circuit, where the impedance of the resonant LC circuit becomes a short or an open at a resonant frequency. When the resonant circuit is connected in parallel with the active device, a positive feedback path is created in the active device at the resonant frequency of the LC circuit. The positive feedback path causes the active device to oscillate at the resonant frequency of the LC circuit.

The resonant tuned LC circuit typically includes multiple fixed capacitors that can be switched in or out of the LC circuit, a varactor diode, and at least one inductor. The resonant frequency of the LC circuit (and therefore the oscillation frequency of the VCO) is tuned via a coarse tuning mechanism and a fine tuning mechanism. Coarse frequency tuning (or band-selection) is performed by switching one or more of the fixed capacitors in the LC circuit. Whereas, fine frequency tuning is performed by changing the voltage across the varactor diode, which produces a capacitance that varies depending on the applied tuning voltage. Both tuning mechanisms operate by changing the capacitance, and therefore the resonant frequency of the LC circuit. The varactor tuning range is slightly larger than one fixed capacitor, and therefore provides some overlap between the fixed capacitors.

VCO gain is defined as the VCO frequency shift per unit change in the varactor tuning voltage. A problem with varactor-tuned VCOs is that the VCO gain verses fixed capacitance is variable. In other words, the VCO frequency shift verses tuning voltage is dependent on the fixed capacitance that is switched-in to the LC circuit. The variable VCO gain creates difficulties when designing a PLL because the entire PLL loop gain, bandwidth, and damping response varies with respect to the oscillator frequency. This in turn makes it difficult to optimize the output phase noise and reduces overall spectral purity. Therefore, it is desirable to compensate for the variable VCO gain, in order to maintain the overall PLL gain at a desired optimum value.

In addition to the VCO gain, it is desirable to adjust or tune other PLL characteristics, such as loop bandwidth, reference frequency, and damping factor, without having to tune or replace PLL components.

BRIEF SUMMARY OF THE INVENTION

The gain compensator invention compensates for gain variation in a varactor-tuned VCO in order to maintain the overall PLL gain at a desired level over frequency. The VCO includes a LC circuit that has multiple fixed capacitors that are arranged in parallel with the varactor diode and the active portion of the VCO. The fixed capacitors are switched-in to the LC circuit by corresponding capacitor control signals. Coarse frequency tuning (also called band-select tuning) is performed by adding or subtracting one or more of the fixed capacitors to the LC circuit according to the capacitor control signal. Fine frequency tuning is performed by adjusting the tuning voltage on the varactor diode, where the VCO gain is defined as the frequency shift per unit change in varactor tuning voltage. VCO gain varies with the fixed capacitance that is switched-in to the LC circuit, and therefore changes with band-select tuning of the VCO. The gain compensator compensates for the variable VCO gain by generating a reference charge pump current for the PLL based on information that is carried in the capacitor control signal. Therefore, the gain compensator is able to simultaneously adjust the charge pump current to maintain an overall flat PLL gain as fixed capacitors are incrementally added to (or subtracted from) the LC circuit.

The gain compensator includes one or more cells that each correspond to a particular VCO that can be switched into the PLL at a given time. A VCO control signal selects a particular VCO for the PLL based on frequency, and also activates the appropriate cell. Each cell includes a plurality of unit current sources, where each unit current source substantially replicates (or copies) a pre-defined reference scale current. The unit current sources are arranged into one or more groups, where each group corresponds to a fixed capacitor in the LC circuit. Each group of unit current generates a portion of the total pump current when the corresponding capacitor is switched-in to the LC circuit. The number of unit current sources in each group is determined to compensate for the variable VCO gain that occurs when the corresponding fixed capacitor is switched-in to the LC circuit. Each group of unit current sources is activated by the same capacitor control signal that controls the corresponding fixed capacitor. Therefore, when a fixed capacitor is switched-in to the LC circuit, the corresponding group of unit current sources is simultaneously activated and switched-in to the cell to compensate for the variable VCO gain that is caused by the fixed capacitor.

An advantage of the gain compensator invention is that the number of unit current sources that are activated for a corresponding fixed capacitor is arbitrary, but the current produced is linearly proportional to the reference scale current. In other words, there is no predefined relationship between the number of unit current sources in each group that would restrict the relative amount of current produced by each group. Therefore, the total pump current can be freely optimized to incrementally adjust for the variable VCO gain that is associated with various combinations of fixed capacitors.

A further advantage of the gain compensator invention is that the reference scale current for the gain compensator cells is generated based on a PLL control signal. The PLL control signal specifics various PLL characteristics, such as the frequency of the reference signal, the PLL bandwidth, and the PLL damping factor, etc. Since the unit current sources are configured to replicate the reference scale current, all of the unit current sources can be simultaneously adjusted by changing the reference scale current. Therefore, the charge pump current can be efficiently adjusted to tune the mentioned characteristics of PLL for different operating conditions, without requiring the replacement of PLL components.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

Figure 8:
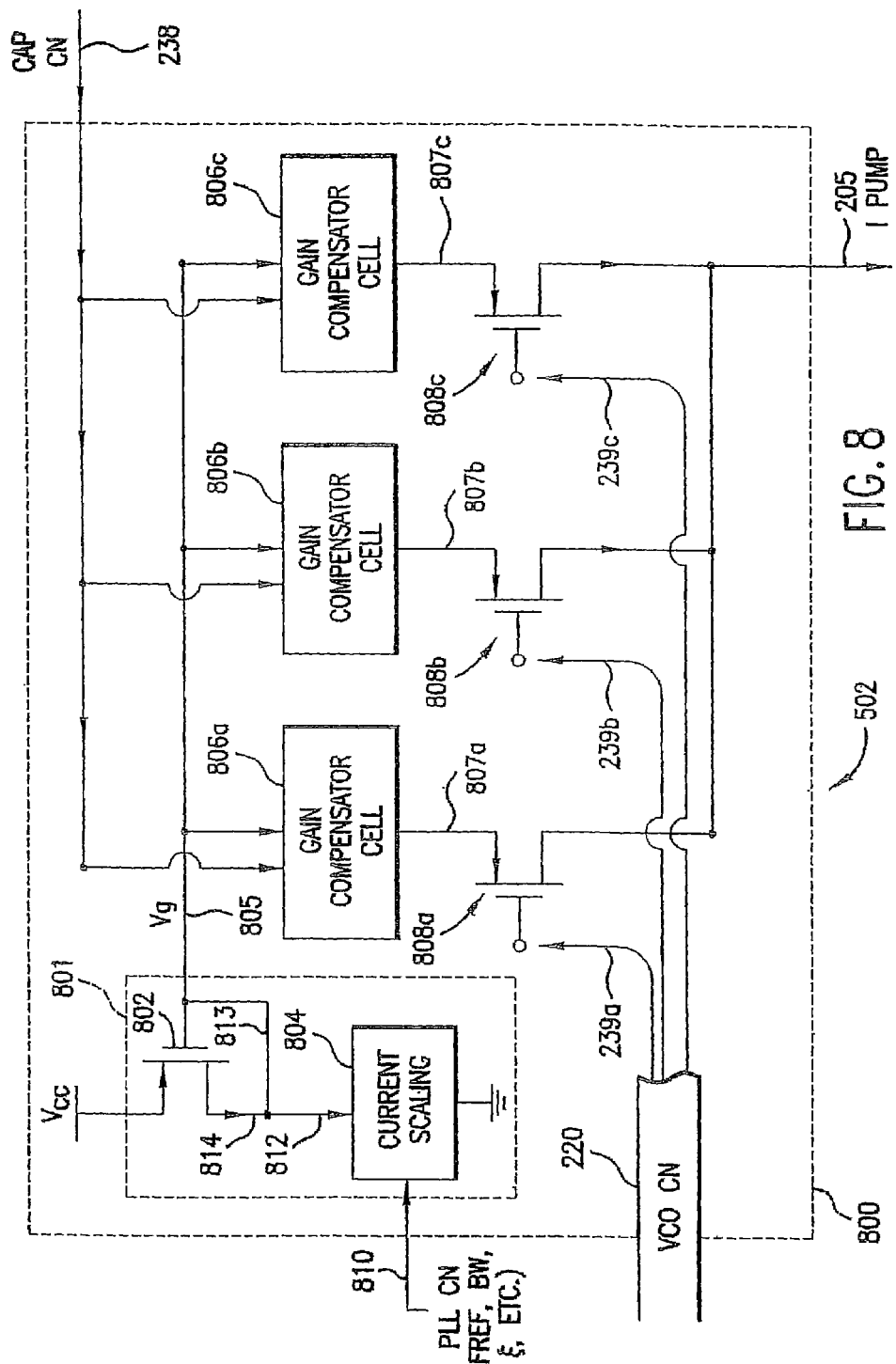
Figure 10:
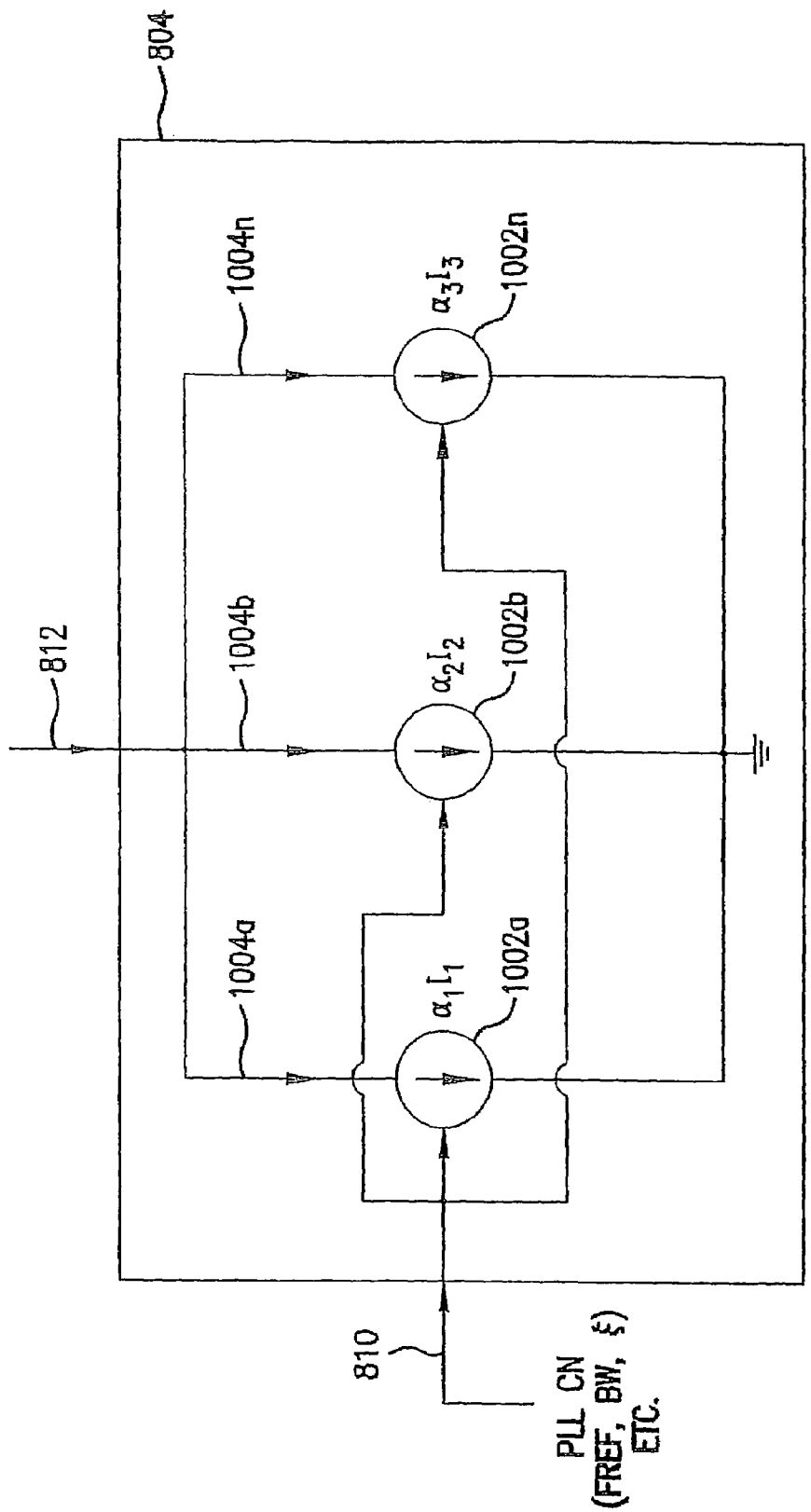
Figure 11:
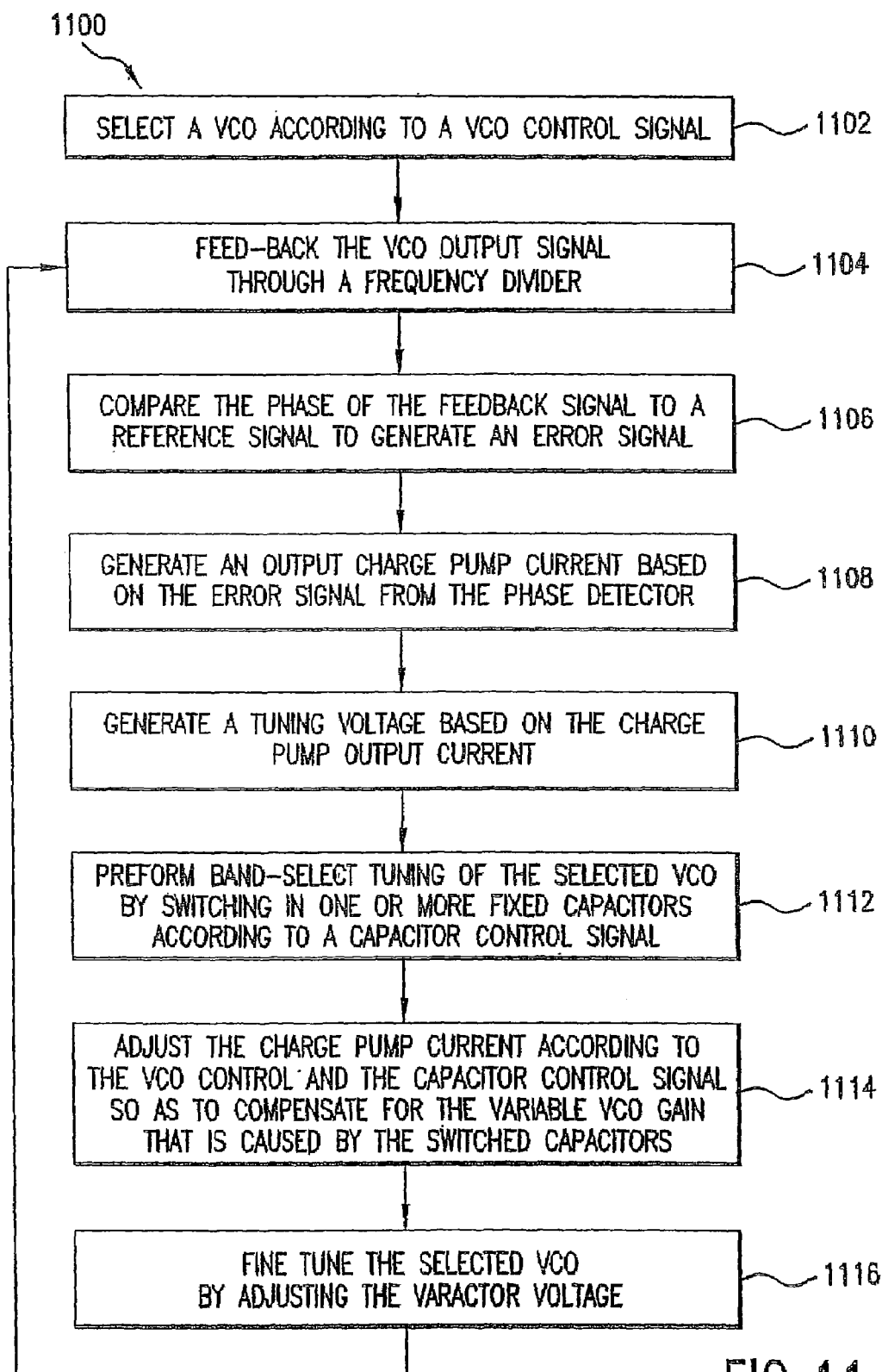
Figure 12:
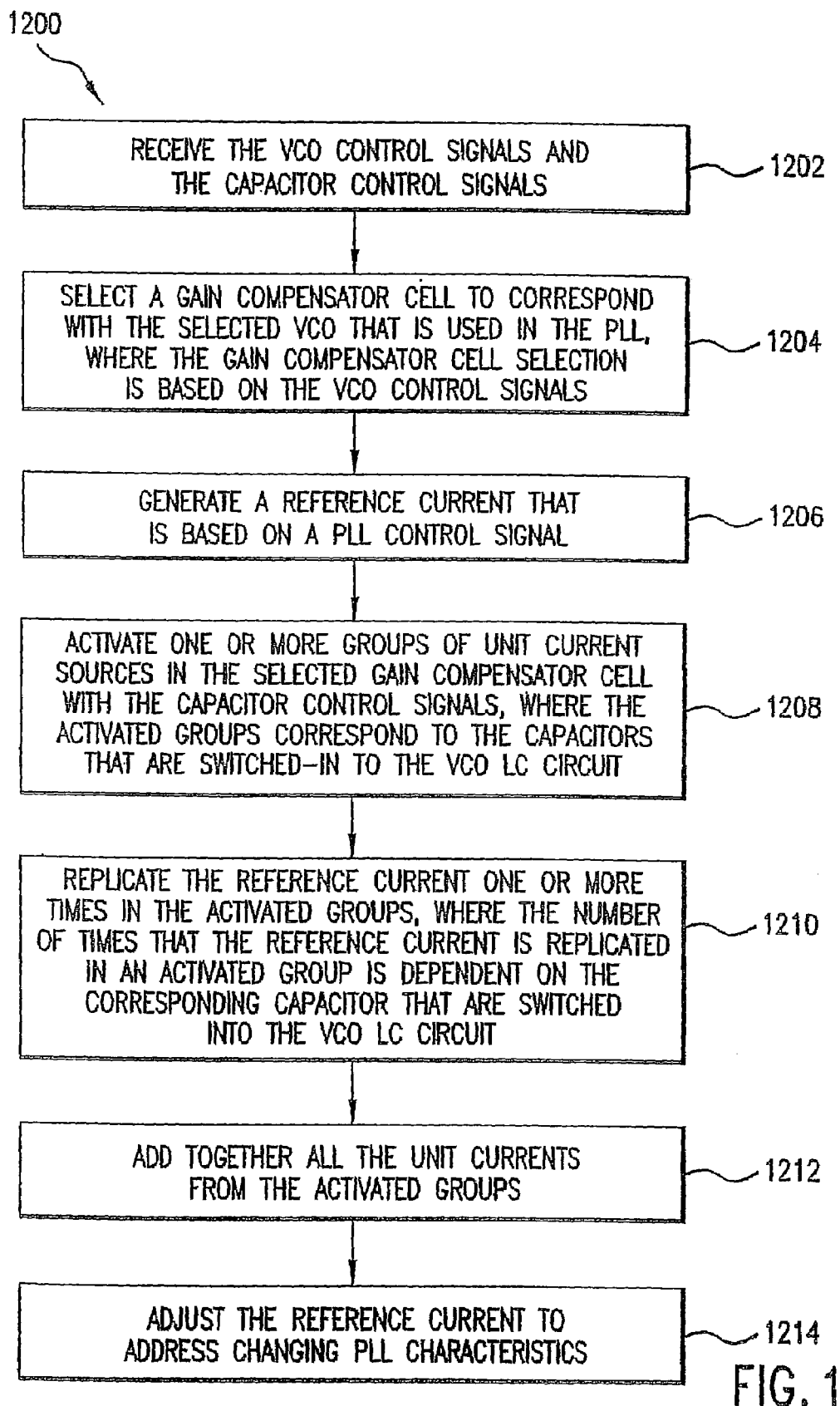

FIG. 8 illustrates a gain compensator 800 having a current scaler 804 that forms a current mirror configuration with one or more gain compensator cells 806, according to embodiments of the present invention;

FIG. 9 illustrates again compensator cell 806 having multiple unit current sources, according to embodiments of the present invention;

FIG. 10 illustrates the current scaler 804, according to embodiments of the present invention;

FIG. 11 illustrates a flowchart 1100 that describes the operation of a PLL having compensation for nonlinear VCO gain, according to embodiments of the present invention; and FIG. 12 illustrates a flowchart 1200 that describes the operation of a gain compensator cell, according to embodiments of the present invention.

DETAILED DESCRIPTION OF THE INVENTION

1. Example Tuner Application

Before describing the invention in detail, it is useful to describe an example tuner application for the invention. The invention is not limited to the tuner application that is described here, and is applicable to other tuner and non-tuner applications as will be understood to those skilled in the relevant arts based on the discussions given herein.

Figure 1A:
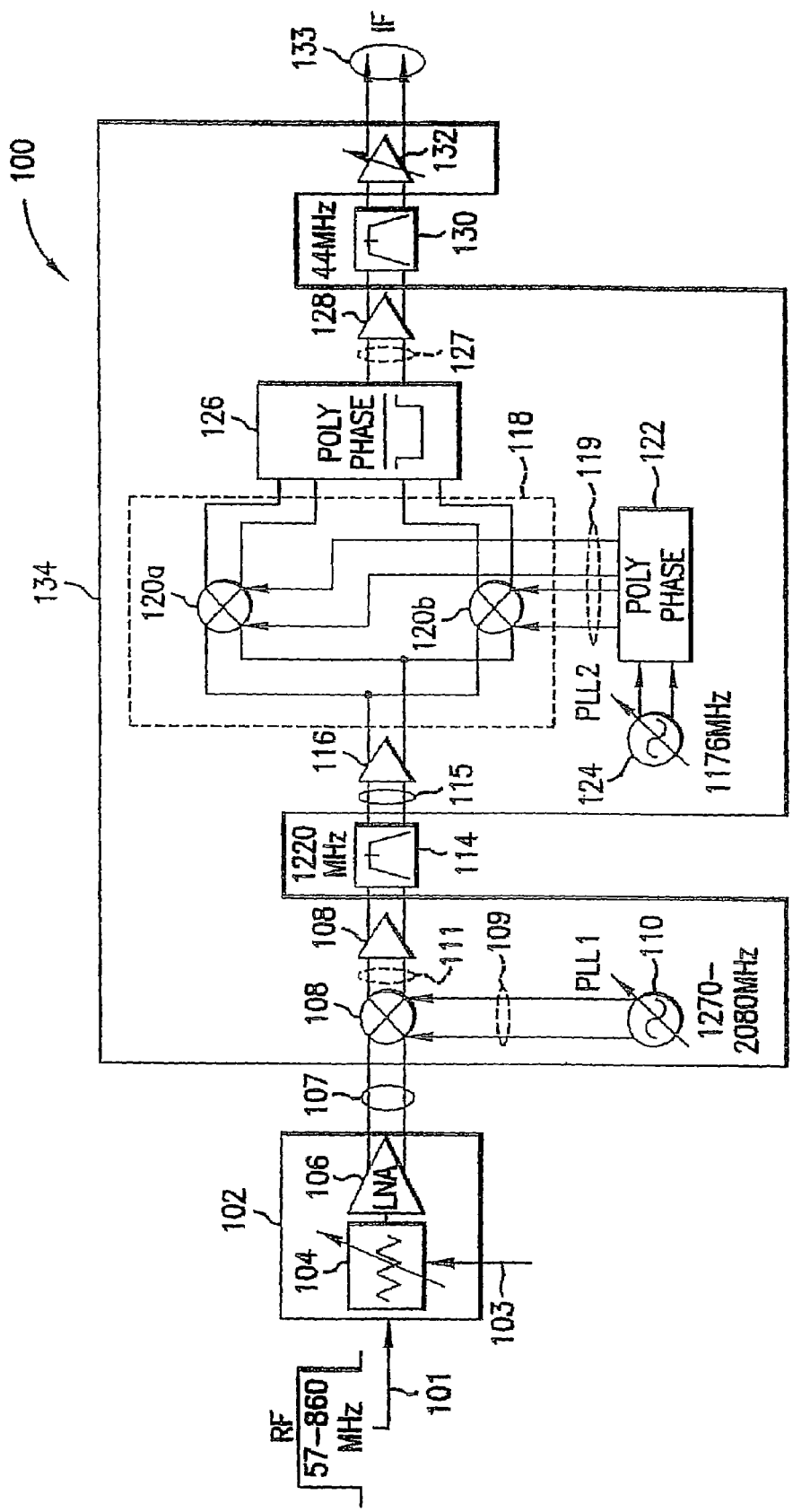
FIG. 1A illustrates a tuner 100 that is an example tuner environment for the present invention.

FIG. 1A illustrates a schematic of a tuner assembly 100 that has an RF automatic gain control circuit (AGC) 102, and a tuner 134. The tuner assembly 100 receives an RF input signal 101 having multiple channels and down-converts a selected channel to an IF frequency, to produce an IF signal 133. For instance, the RF input signal 101 can include multiple TV channels that typically have 6 MHZ frequency spacings and cover a range of 57-860 MHZ, and where the selected channel is down-converted to an IF frequency at 44 MHZ, 36 MHZ or some other desired IF frequency for further processing. The structure and operation of the AGC circuit 102 and the tuner 134 are described in further detail below.

The AGC circuit 102 provides automatic gain control using a variable resistor 104 and a low noise amplifier (LNA) 106. The variable resistor 104 attenuates the RF input signal 101 according to a control signal 103. In embodiments, the control signal 103 is based on the signal amplitude of the IF signal 133 so that the RF front-end gain can be adjusted to achieve a desired amplitude for the IF signal 133. The LNA 106 provides low noise amplification and converts a single-ended input signal to a differential RF signal 107.

The tuner 134 has a dual conversion architecture (one up-conversion, one down-conversion) that includes an input mixer 108 and an image reject mixer 118. The input mixer 108 is driven by a first phase locked loop (PLL) 110 that has coarse tuning capability from 1270-2080 MHz. The image reject mixer 118 has two component mixers 120a and 120b that are driven in quadrature by a second PLL 124 through a quadrature polyphase filter 122. The PLL 124 has a relatively fixed frequency of 1176 MHZ (for a 44 MHZ IF) and has fine frequency tuning capability. A polyphase filter 126 is coupled to the output of the image reject mixer 118 to combine the quadrature outputs of the mixers 120. Two separate off-chip surface acoustic wave (SAW) filters 114 and 130 are used to perform IF filtering in the tuner 134. The first SAW filter 114 is connected between the first mixer 108 and the image reject mixer 118. The passband of the SAW filter 114 is centered at 1220 MHZ, and is only a few channels wide (e.g. 1-3 channels wide or 18 MHZ for 6 MHZ TV channel spacings). The second SAW filter 130 has a passband at 44 MHZ and is coupled to the output of the polyphase filter 126. Additionally, various on-chip amplifiers 108, 116, 128, and 132 are included throughout the tuner 134 to provide signal amplification, as necessary.

Figure 1B:
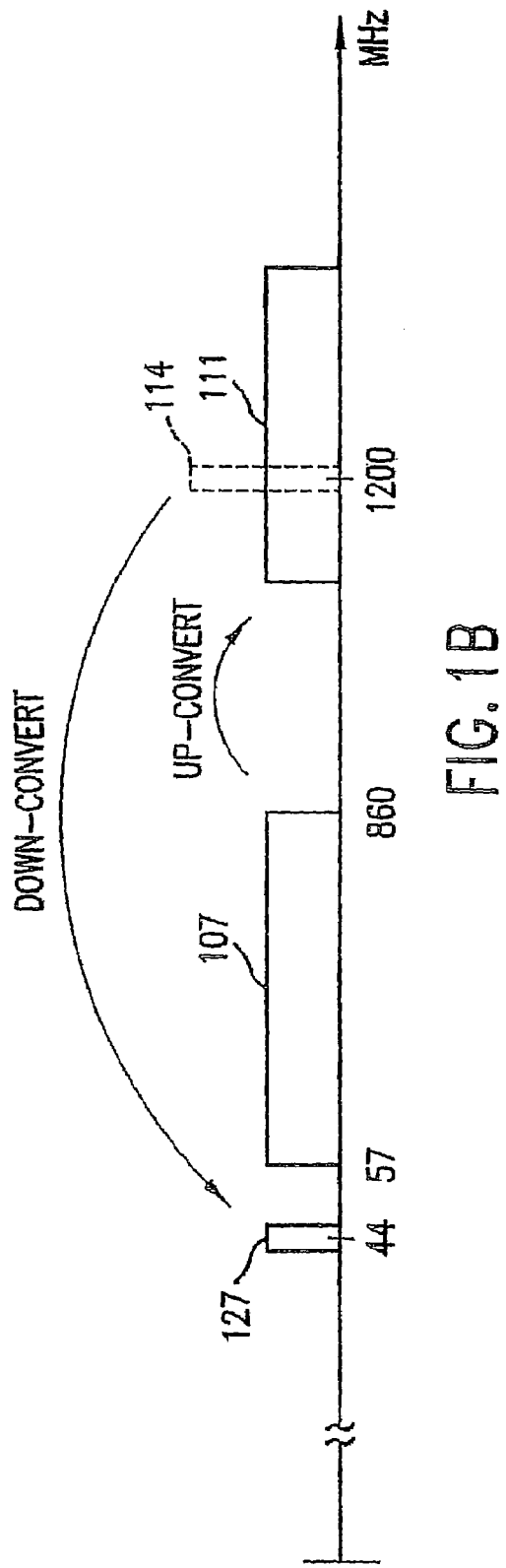
FIG. 1B illustrates dual frequency conversion that is performed by the tuner 100.

The operation of the tuner 134 is described as follows and in reference to the frequency spectrum that is illustrated in FIG. 1B. The first mixer 108 mixes the RF signal 107 with a LO signal 109 that is generated by the PLL 110. Since the PLL 110 is tunable from 1270-2080 MHZ, the RF signal 107 is up-converted to a first IF 111 having a frequency that is above the 57-860 MHZ input frequency band. The first IF 111 is sent off-chip to the SAW filter 114, which has a narrow passband window centered at 1220 MHz. The first SAW filter 114 selects a desired channel 115 that is within its narrow passband window, and substantially rejects all of the remaining channels. Therefore, a particular channel is selected by varying the frequency of the LO signal 109 so that the desired channel is up-converted into the narrow passband of the IF filter 114. The desired channel 115 (at 1220 MHZ) is sent back on-chip to the image reject mixer 118 that is driven by a quadrature LO signal 119 from the polyphase filter 122. The image reject mixer 118 down-converts the desired channel 115 to a 44 MHZ IF signal 127 that appears at the output of the polyphase filter 126, where I and Q components of the IF signal 127 are combined in the polyphase filter 126. Finally, the IF signal 127 is filtered a second time by the bandpass SAW filter 130 to reject any unwanted frequency harmonics, producing the output IF signal 133 at 44 MHZ and carrying the information in the desired channel.

The specific frequencies mentioned in the description of the tuner assembly 100, and throughout this application, are given for example purposes only and are not meant to be limiting. Those skilled in the arts will recognize other frequency applications for the tuner assembly 100 based on the discussion given herein. These other frequency applications are within the scope and spirit of the present invention.

2. Phase Lock Loop

Figure 2:
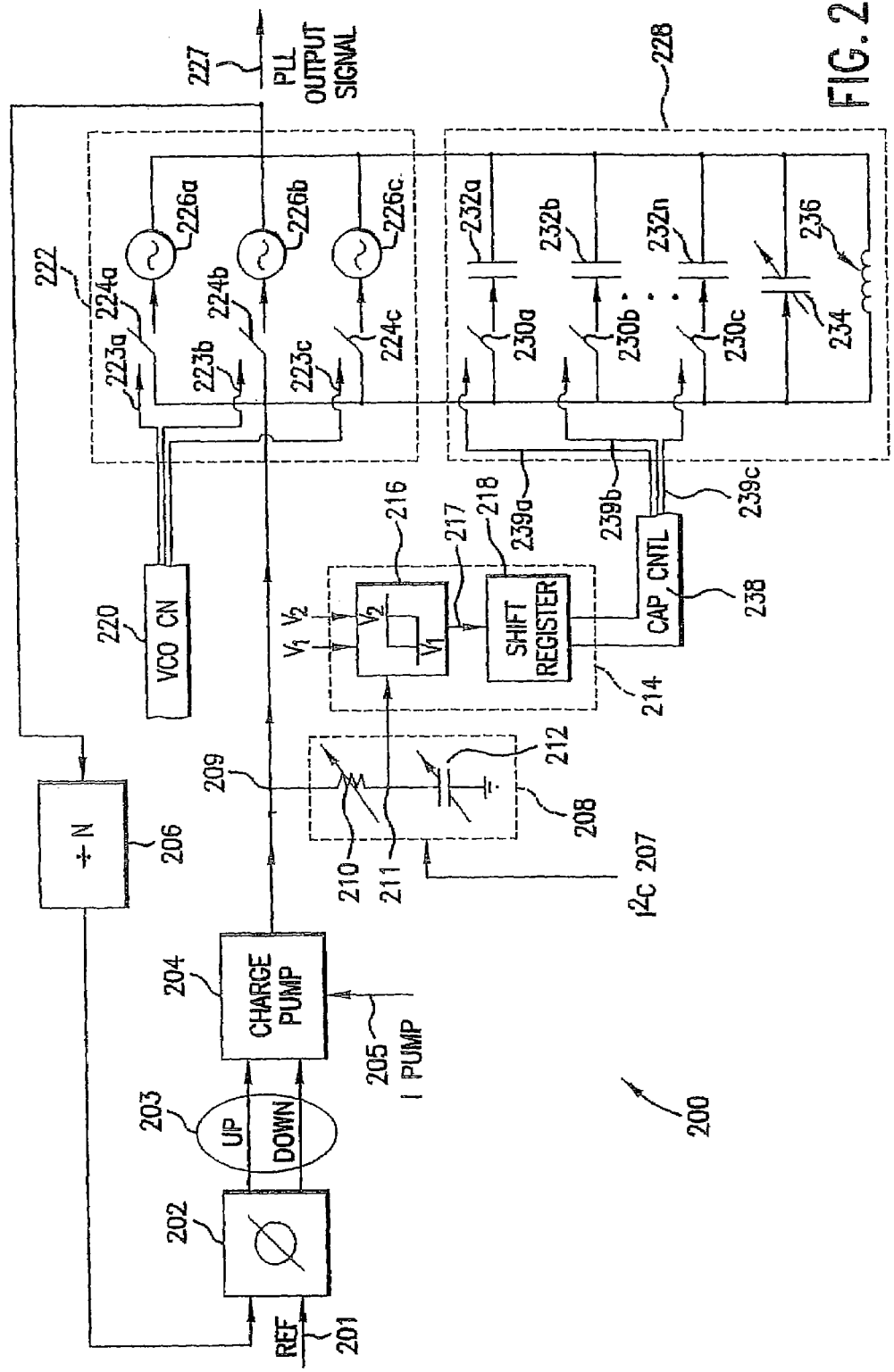
FIG. 2 illustrates a PLL 200 that can be used with the tuner 100.

The first PLL 110 and the second PLL 124 are represented by the PLL 200 that is illustrated in FIG. 2. The PLL 200 generates a PLL output signal 227 that is a frequency multiple of a reference signal 201, and where the output signal 227 is phase-locked to the reference signal 201. The PLL 200 self-corrects for any phase (and therefore frequency) variations between the reference signal 201 and the output signal 227 via a feedback mechanism that is described as follows. The structure and operation of the PLL 200 are described as follows.

The PLL 200 structure includes: a phase detector 202, a charge pump 204, a frequency divider 206, a loop filter 208, a coarse tuning circuit 214, a VCO assembly 222, and a LC resonant circuit 228. The loop filter 208 includes a variable resistor 210 and a variable capacitor 212 that are controlled by an I²C signal 207. The coarse tuning circuit 214 includes a comparator 216 and a shift register 218. The VCO assembly 222 includes multiple component VCOs 226a-c, where each VCO 226 preferably covers a particular frequency band. A VCO 226 is switched-in to the PLL 200 by closing a corresponding switch 224. The switches 224a-c are controlled by corresponding control signals 223a-c that make-up a VCO control bus 220. The LC resonant circuit 228 is connected in parallel with the VCO assembly 222 and includes: multiple fixed capacitors 232a-n having corresponding switches 230a-n, a varactor 234, and an inductor 236. One or more of the fixed capacitors 232 are switched in-parallel with the selected VCO 226 by closing the corresponding switch(s) 230. The switches 230 are controlled by corresponding control signals 239a-n that make-up a capacitor control bus 238.

Each VCO 226 is a resonant tuned oscillator whose oscillation frequency is controlled by the resonant frequency of the parallel LC circuit 228. The resonant frequency of the LC circuit 228 is determined by the relative total capacitance and inductance according to the equation:

$$f_0 = (1/2\pi) \cdot 1/\text{sqrt}(LC) \quad \text{Eq. 1}$$

As discussed further below, coarse frequency tuning (e.g. band-selection) of the selected VCO 226 is performed by switching in one or more of the fixed capacitors 232 into the LC circuit 228. This changes the resonant frequency of the LC circuit 228, and therefore the oscillation frequency of the selected VCO 226. Fine frequency tuning is performed by changing the control voltage on the varactor 234, which has a variable capacitance that changes with applied voltage. The VCO gain is defined as the change in the VCO output frequency per unit change in the voltage across the varactor 234.

The PLL 200 operates based on known PLL feedback principles. A VCO 226 is selected based on the desired frequency of operation for the PLL 200, and is switched-in to the PLL 200 by closing the appropriate switch 224 using the appropriate control signal 223. The PLL output signal 227 from the selected VCO 226 is fed back to a phase detector 202 through the frequency divider 206. The frequency divider 206 normalizes the frequency of the output signal 227 to that of the reference signal 201 for comparison in the phase detector 202. The phase detector 202 compares the phase of the output signal 227 to the reference signal 201, and generates a DC error signal 203 that represents the phase difference between the two signals. The charge pump 204 receives the error signal 203 and a reference pump current 205. The charge pump 204 sources (or sinks) a percentage of the pump current 205 based on the error signal 203, as will be understood by those skilled in the arts. The output current of the charge pump 204 drives the loop filter 208 to produce a tuning voltage 209. Part of the tuning voltage 209 is dropped across the variable capacitor 212 to generate a tuning voltage 211. As discussed further below, the tuning voltages 209 and 211 control the oscillation frequency of the selected VCO 226.

The tuning voltages 209 and 211 adjust the resonant frequency of the LC circuit 228 (and therefore the oscillation frequency of the selected VCO 226) via a coarse tuning mechanism and a fine tuning mechanism, respectively. More specifically, the coarse tuning circuit 214 adds (or subtracts) one or more of the fixed capacitors 232a-n to the LC circuit 228 based on the tuning voltage 211. Similarly, the tuning voltage 209 directly adjusts the voltage (and therefore the capacitance) of the varactor 234 to implement fine frequency tuning. Both tuning mechanisms adjust the oscillation frequency of the VCO 226 by changing the capacitance of the LC circuit 228, which shifts the resonant frequency of the LC circuit 228. The tuning range of the varactor 234 is slightly larger than one fixed capacitor 232, and therefore provides some tuning overlap between the fixed capacitors 232. The coarse tuning circuit 214 is described further below.

The coarse tuning circuit 214 includes a window comparator 216 and a bi-directional shift register 218. The window comparator 216 receives the tuning voltage 211 and also receives input reference voltages $v_1$ and $v_2$. The window comparator 216 determines if the voltage 211 is within a voltage "window" that is defined between the input references voltages $v_1$ and $v_2$, and generates a control signal 217 that controls the bi-directional shift register 218 based on this determination. The shift register 218 stores a series of bits that control the capacitor switches 230 via the control bus 238 to add (or subtract) the corresponding capacitors 232 to (or from) the LC circuit 228. A "1" bit on the control line 239 causes the corresponding switch 230 to close and thereby adds the corresponding capacitor 232 to the LC circuit 228. A "0" bit on the control line 239 causes the switch 230 to open and thereby subtracts the corresponding capacitor 232 from the LC circuit 228.

The coarse tuning circuit 214 operates to self-correct coarse variations in the oscillation frequency of the selected VCO 226 by adding or subtracting capacitors 232, based on the tuning voltage 211. If the comparator 216 determines that the voltage 211 is below $v_1$, then the comparator 216 causes a series of "1"s to be shifted through the shift register 218, which incrementally adds capacitors 232 to the LC circuit 228 until the tuning voltage 211 is within the $v_1$-to-$v_2$ voltage window. If the comparator 216 determines that the voltage 211 is above the voltage $v_2$, then the comparator 216 causes a series of "0"s to be shifted through the shift register 218, which incrementally subtracts capacitors 232 from the LC circuit 228 until the tuning voltage 211 is within the $v_1$-to-$v_2$ voltage window. As described above, the frequency of the selected oscillator 226 changes whenever capacitance is added to, or subtracted from, the LC circuit 228. If the comparator 216 determines that the voltage 211 is within the voltage window defined by $v_1$ and $v_2$, then no action is taken and the fixed capacitance in the LC circuit 228 remains unchanged. In other words, the tuning voltage 211 is within an acceptable voltage range (or "window"), and correspondingly, the frequency of the output signal 227 is within an acceptable frequency range. Therefore the number of the fixed capacitors 232 that are switched-in to the LC circuit 228 is not changed.

3. Example VCO Configuration

Figure 3:
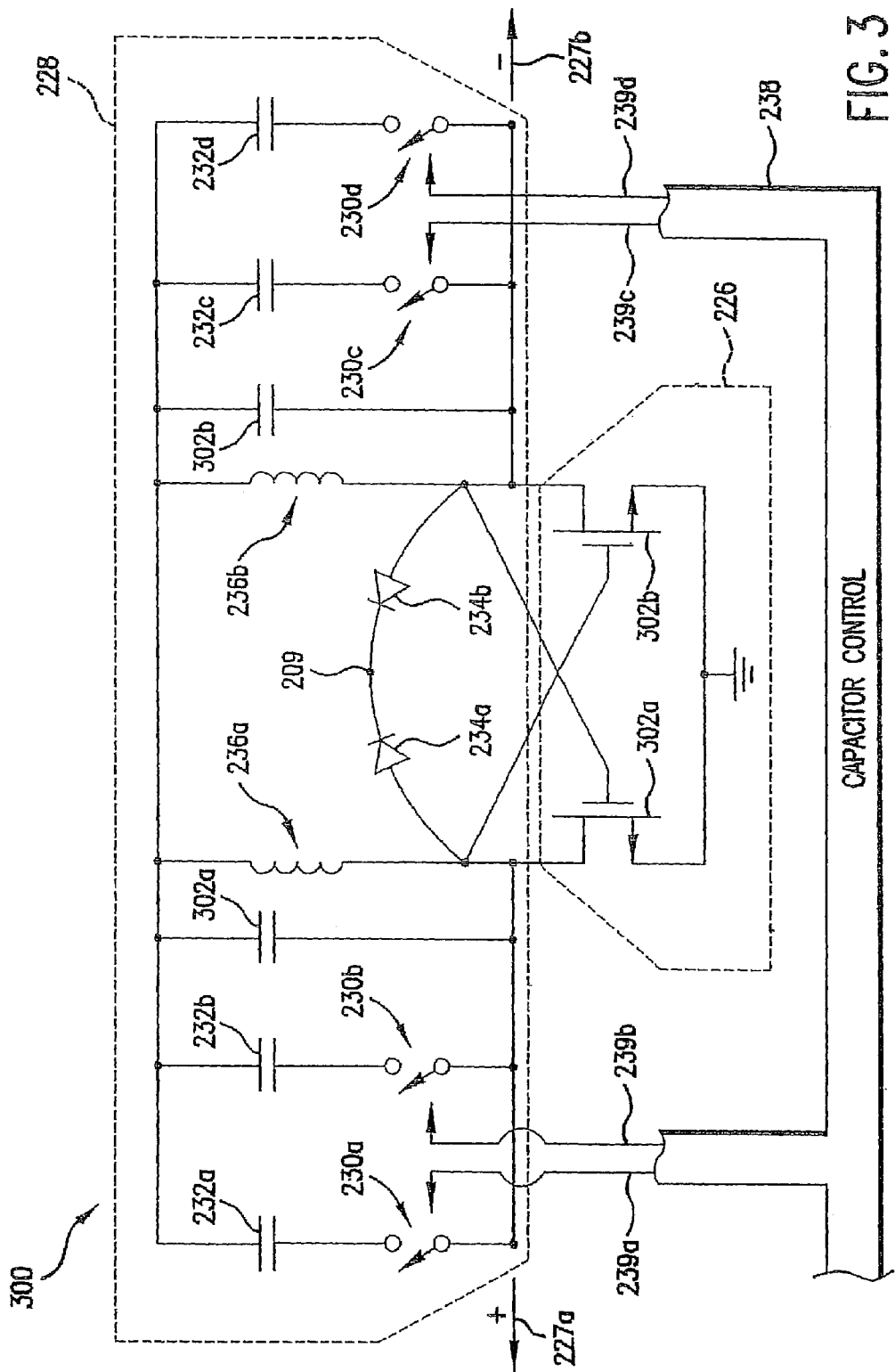
FIG. 3 illustrates a VCO 300 that can be used with the PLL 200.

FIG. 3 illustrates a differential VCO 300 as one embodiment of VCO 226 and the LC resonant circuit 228. The VCO 300 is meant for example purposes only and is not meant to limit the invention in any way. Other oscillator configurations could be utilized to practice the invention, as will be understood by those skilled in the relevant arts based on the discussions given herein.

The VCO 300 includes the active VCO portion 226 and the resonant LC circuit 228. The active portion includes a pair of cross coupled transistors 302a and 302b that oscillate at the resonant frequency of LC circuit 228. In this cross-coupled configuration, the drain of transistor 302a is connected to the gate of transistor 302b. Likewise, the drain of transistor 302b is connected to the gate of the transistor 302a. The LC circuit 228 is also coupled to the drains of the transistors 302. At resonance, the LC circuit 228 causes a positive feedback path between the cross-coupled transistors 302, which causes the transistors to oscillate at the resonant frequency of the LC circuit 228, producing the differential output signal 227.

The oscillation frequency of the VCO 300 can be tuned by two mechanisms. Coarse frequency tuning (or band selection) is performed by adding or subtracting the fixed capacitors 232 using the corresponding switches 230. Fine frequency tuning is performed by the tuning voltage 209, which varies the capacitance produced by the series-connected varactor diodes 234a and 234b that are attached to the drains of the transistors 302. The frequency change of VCO 300 per unit change in varactor 234 voltage is defined as the VCO gain. As stated above, the tuning range of the varactor 234 is slightly larger than the capacitance of one fixed capacitor 232, and therefore provides some tuning overlap between the fixed capacitors 232.

In one embodiment, the varactors 234 are PN junction varactors, and in an alternate embodiment these varactors 234 are MOSFET varactors, depending on the designer's preference.

4. PLL Gain Compensation

PLL gain is defined as the frequency change of the output signal verses the phase difference between the feedback signal and the reference signal. The forward PLL gain is determined as follows:

$$G(s) = K_{PHI} \cdot (R_{LF} + 1/sC_{LF}) \cdot K_{VCO}/s;$$ Eq. 2 where:
$K_{PHI}$=Phase detector gain (mA/radian)
$R_{LF}$=Loop filter resistance
$C_{LF}$=Loop filter capacitance
$K_{VCO}$=VCO gain (MHZ/volt)
s represents frequency The feedback PLL gain H(s)=1/N, where N is the feedback frequency division ratio. The overall open loop gain is G(s) H(s), and the overall closed-loop gain is G(s)/[1+G(s)H(s)].

Figure 4:
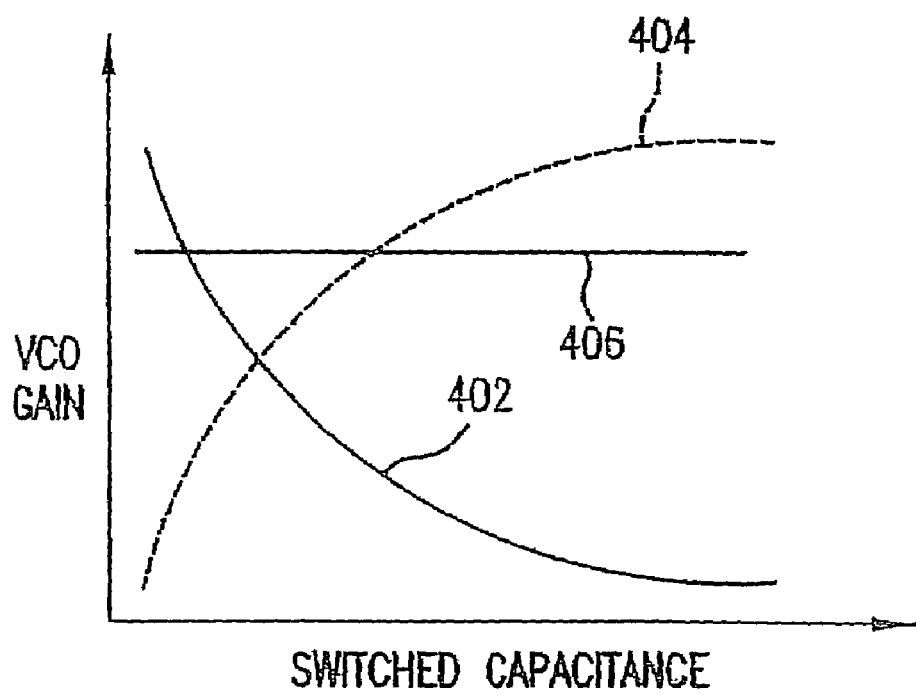
FIG. 4 illustrates variable VCO gain.

As described above, the PLL 200 performs coarse frequency tuning by incrementally adding (or subtracting) one or more of the fixed capacitors 232 that are in-parallel with the selected VCO 226. Fine frequency tuning is performed by adjusting the voltage on the varactor 234, where the VCO gain is defined as the frequency shift per unit change in the tuning voltage 209. A problem with varactor-tuned VCOs is that the VCO gain verses the fixed capacitance 232 is variable. FIG. 4 illustrates this characteristic with a graph of VCO gain 402 verses fixed capacitance. As shown, the VCO gain curve 402 is reduced for a large fixed capacitance and is increased for a small fixed capacitance. Variable VCO gain is undesirable because it causes the PLL forward gain to change according to Eq. 2. In VCO applications with a large minimum-to-maximum capacitance tuning range, this VCO gain variability can cause loop instability, and reduced spectral purity in the PLL output signal. In a preferred embodiment, the VCO gain variability is compensated for by a compensator gain 404 so that the overall PLL gain 406 remains relatively flat for variations in fixed capacitance (and therefore VCO frequency). More specifically, the charge pump current 205 is compensated to counter the variable VCO gain so that the overall PLL gain is flat.

Figure 5:
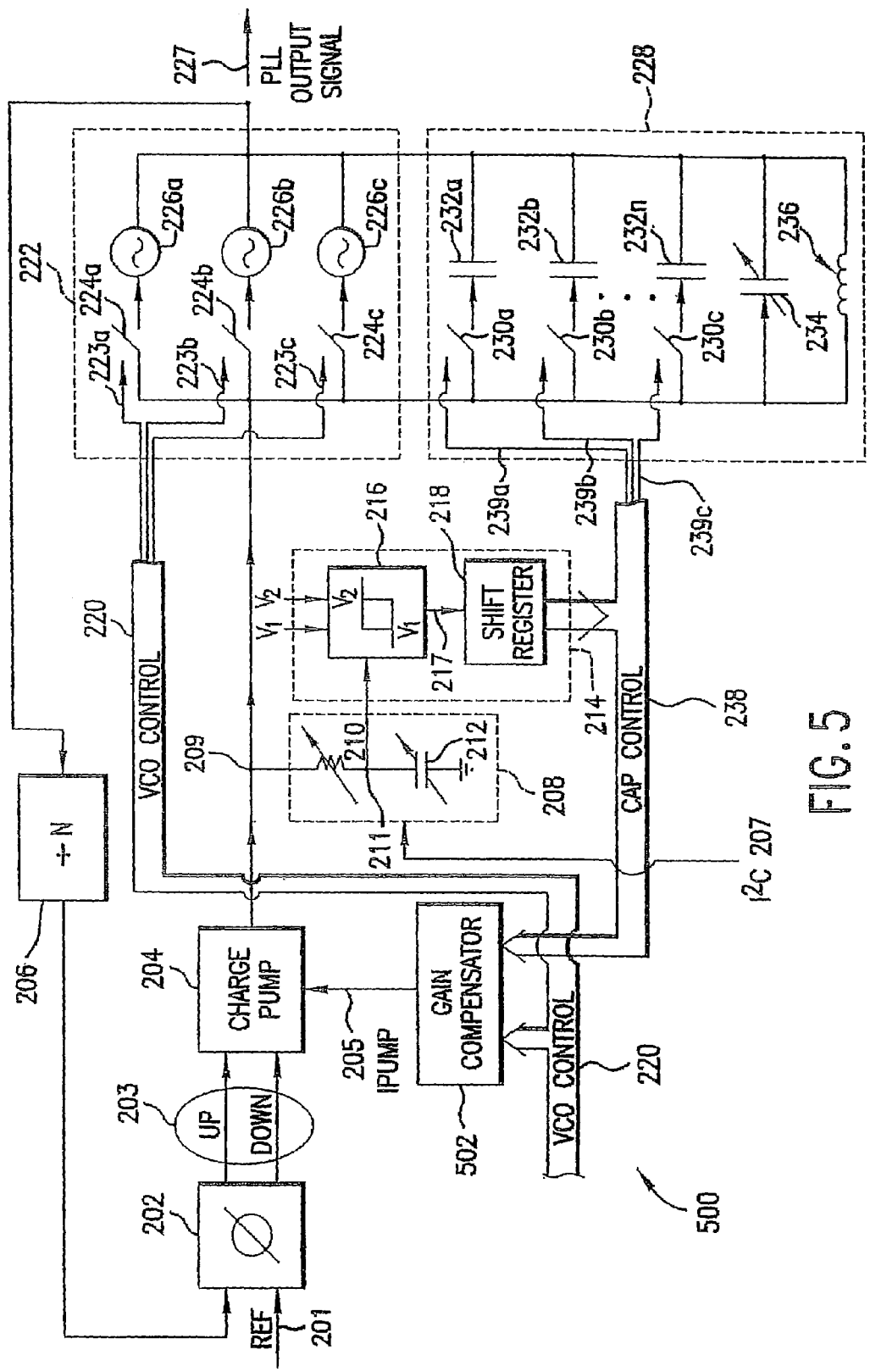
FIG. 5 illustrates a PLL 500 that includes a gain compensator 502, according to embodiments of the present invention.

FIG. 5 illustrates a PLL 500 that has a gain compensator 502 to adjust the charge pump current 205 in order to linearize (and flatten) the overall PLL gain of the PLL 500. The gain compensator 502 generates the pump current 205 based on the control information carried by the VCO control bus 220 and the capacitor control bus 238. As discussed above, the VCO control bus 220 selects the appropriate VCO 226 based on the desired frequency range for the PLL output signal 227. The capacitor control bus 238 selects the fixed capacitors 232 that are switched-in parallel with the selected VCO 226 for coarse frequency tuning of the VCO 226. Therefore, the gain compensator 502 can tailor the reference pump current 205 for a specified VCO 226 at a specified fixed capacitance 232 value, and thereby compensate for the variable VCO gain vs. fixed capacitance.

Figure 6:
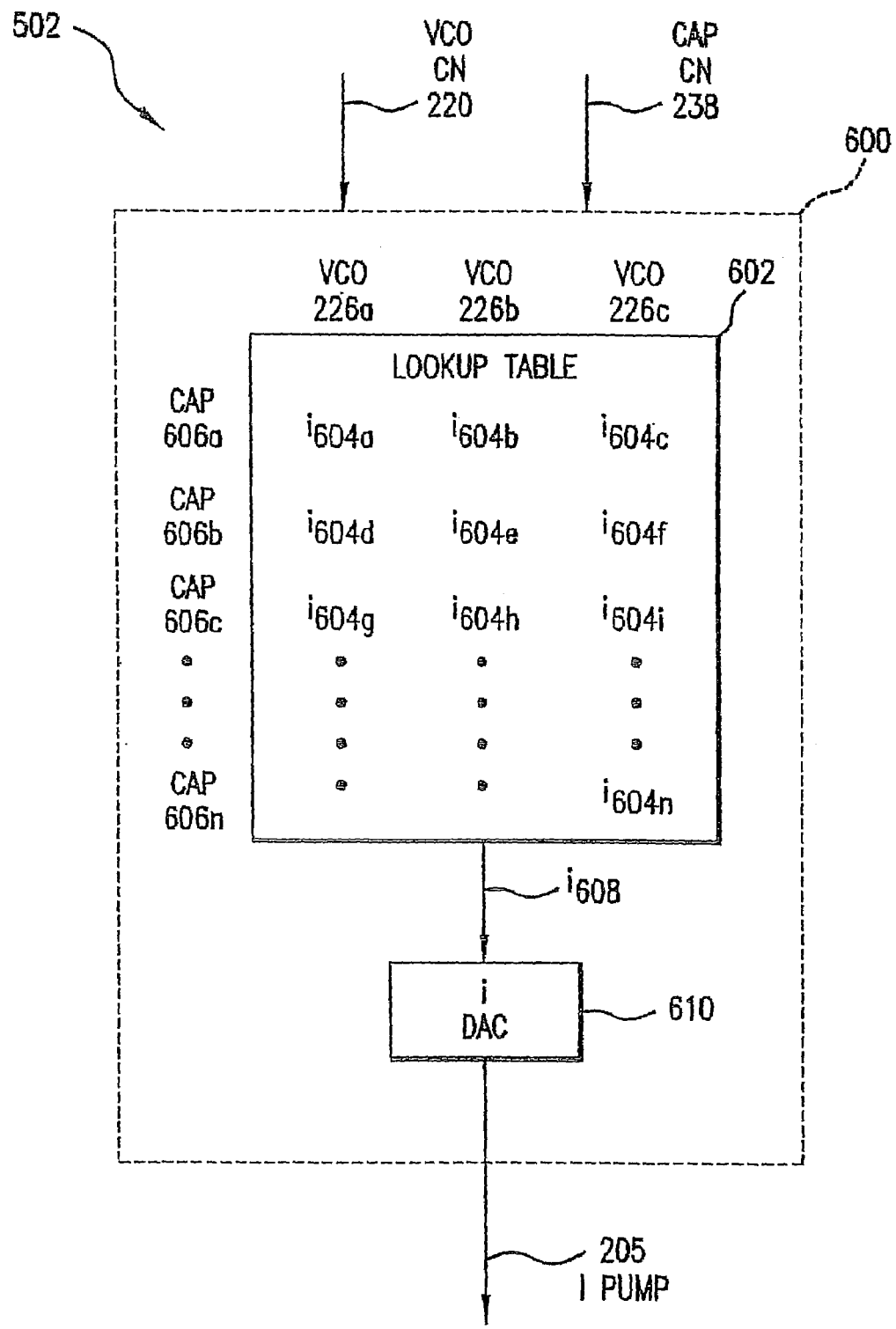
FIG. 6 illustrates a ROMDAC 600 that is one embodiment of a gain compensator, according to embodiments of the present invention.

FIG. 6 illustrates a read only memory digital-to-analog converter (ROMDAC) 600 that is one example embodiment of the gain compensator 502, according to embodiments of the invention. Referring to FIG. 6, the ROMDAC 600 includes a look-up table 602 and a current digital-to-analog converter 610. The lookup table 602 stores pump current values 604a-n that are indexed by the selected VCO 226 and a fixed capacitance total 606, where the fixed capacitance total 606 is the parallel sum of the capacitors 232 that are switched-in to the LC circuit 228. The pump current values 604 are selected to compensate for the variable VCO gain vs. capacitance, given an identified VCO 226 and the fixed capacitance total 606. Preferably, the PLL 200 is characterized beforehand for each VCO 226 to determine the pump current values 604 that produces a flat overall PLL gain for various capacitance totals 606. The look-up table 602 outputs a pump current value 608 that corresponds to identified VCO 226 and the fixed capacitance total 606. The DAC 610 converts the pump current value 608 to the actual analog pump current 205 that drives the charge pump 204. As capacitors 232 are added to or subtracted from the LC circuit 228, the lookup table 602 selects the appropriate pump current value 604 so as to maintain a flat overall PLL gain. Therefore, the pump current 205 is adjusted for various total capacitance 606 to counteract the variable gain of the selected VCO 226, and thereby flatten the overall gain of the PLL 500.

An advantage of the ROMDAC 600 is that the pump current values 604 can be totally arbitrary and mathematically unrelated to each other. In other words, the pump currents 604 can be individually selected to produce an optimum overall PLL gain for a given VCO 226 and capacitance total 606, without being restricted by any mathematical relationship. In an alternate embodiment, the various pump currents 604 are mathematically related to each other, or to the VCO control signal 220 or the capacitor control signal 238.

In addition to PLL gain, it is desirable to tune various other PLL characteristics, such input reference frequency, loop bandwidth, damping factor, etc. This allows the same PLL to be used in different operating environments. For instance, it is often desirable to have a PLL configuration that is operable with a number of different reference frequencies. If the frequency of the reference signal 201 increases by factor of two, the PLL loop gain should preferably be adjusted to compensate for this increase so that the PLL loop remains stable and accurate. The PLL loop gain can be appropriately adjusted by reducing the frequency division of the frequency divider 206 by a factor of two. However, this would require replacement of the frequency divider 206 for each possible reference frequency, or the use of a programmable frequency divider. Alternatively, the charge pump current could be reduced by a factor of two to get the same effect.

Figure 7:
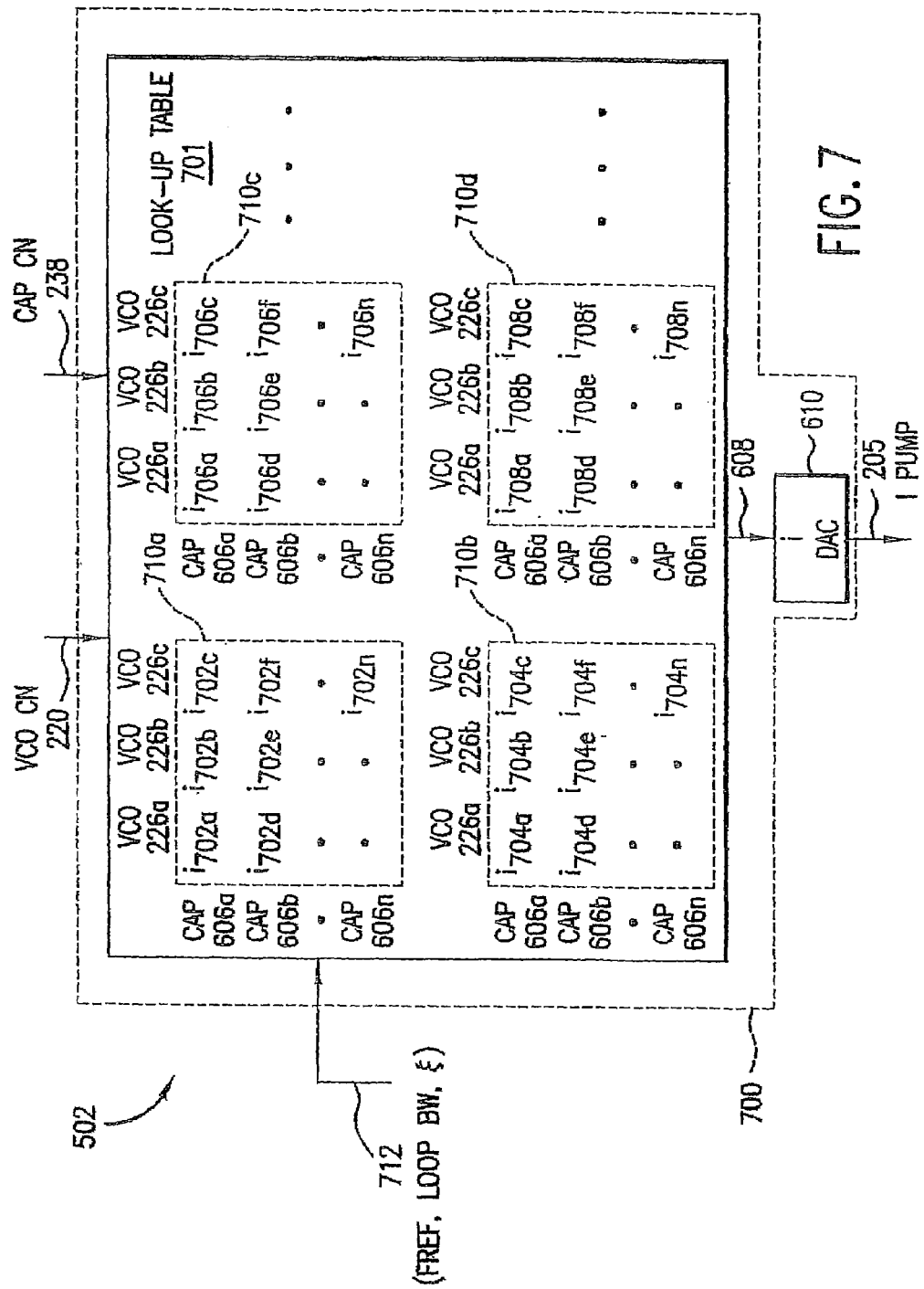
FIG. 7 illustrates a ROMDAC 700 having an expanded look-up table 701, according to embodiments of the present invention.

FIG. 7 illustrates a ROMDAC 700 as another embodiment of the gain compensator 502, according to embodiments of the present invention. The ROMDAC 700 has an expanded lookup table 701 that has multiple sets 710a-d of pump current values, where the sets 710 tune various PLL characteristics in addition to compensating for variable VCO gain. Some PLL characteristics include, but are not limited to, PLL reference signal frequency, loop bandwidth, loop damping, etc. For example, sets 710a and 710b have pump current values 702a-n and 704a-n, respectively, which are customized for different reference frequencies. The pump current values 702a-n can correspond to a first reference signal 201 frequency, and the pump current values 704a-n can correspond to a second reference signal 201 frequency. Therefore, if the frequency of the reference signal 201 changes, then the pump current value 608 can be selected from the appropriate pump current set 710. In another example, the pump current sets 710c and 710d are customized to maintain loop bandwidth for different loop damping factors. The loop damping factor is increased or decreased by adjusting the variable resistor 210 in the loop filter 208, which also determines the loop bandwidth. If the damping factor is changed, then the loop bandwidth can be held constant by selecting the appropriate set 710c or 710d that adjusts the charge pump current 205 to sufficiently counter the effect on the loop bandwidth.

To summarize, by storing multiple sets 710 of charge pump values in the lookup table 701, multiple PLL characteristics can be adjusted or tuned in addition to PLL gain. This allows the same PLL 500 to be used under different PLL operating conditions, without replacing PLL components. The number of pump current sets 710 can be expanded to adjust any number of PLL characteristics, assuming there is sufficient memory space in the look-up table 701.

FIG. 8 illustrates a gain compensator 800 that is another embodiment of the gain compensator 502 in FIG. 5. The gain compensator 800 includes: a voltage generator 801, gain compensator cells 806a-c that correspond to VCOs 226a-c, and PFETs 808a-c that correspond to the gain compensator cells 806a-c. Each gain compensator cell 806 generates a prospective pump current 807 that compensates for the variable VCO gain of its corresponding VCO 226 caused by the fixed capacitors 232. Since only one VCO 226 is operational at a given time, only one prospective pump current 807 becomes the actual pump current 205 that feeds the charge pump 204. The PFETs 808 operate as switches that are controlled by the VCO control signals 239 and select the appropriate prospective pump current 807 to correspond with the selected VCO 226. For example, if the VCO 226a is the selected VCO 226, then the control signal 239a causes the PFET 808a to conduct so that the current 807a becomes the feed for the pump current 205. Accordingly, control signals 239b and 239c cutoff their respective PFETs 808b and 808c, and therefore only the current 807a feeds the pump current 205.

Figure 9:
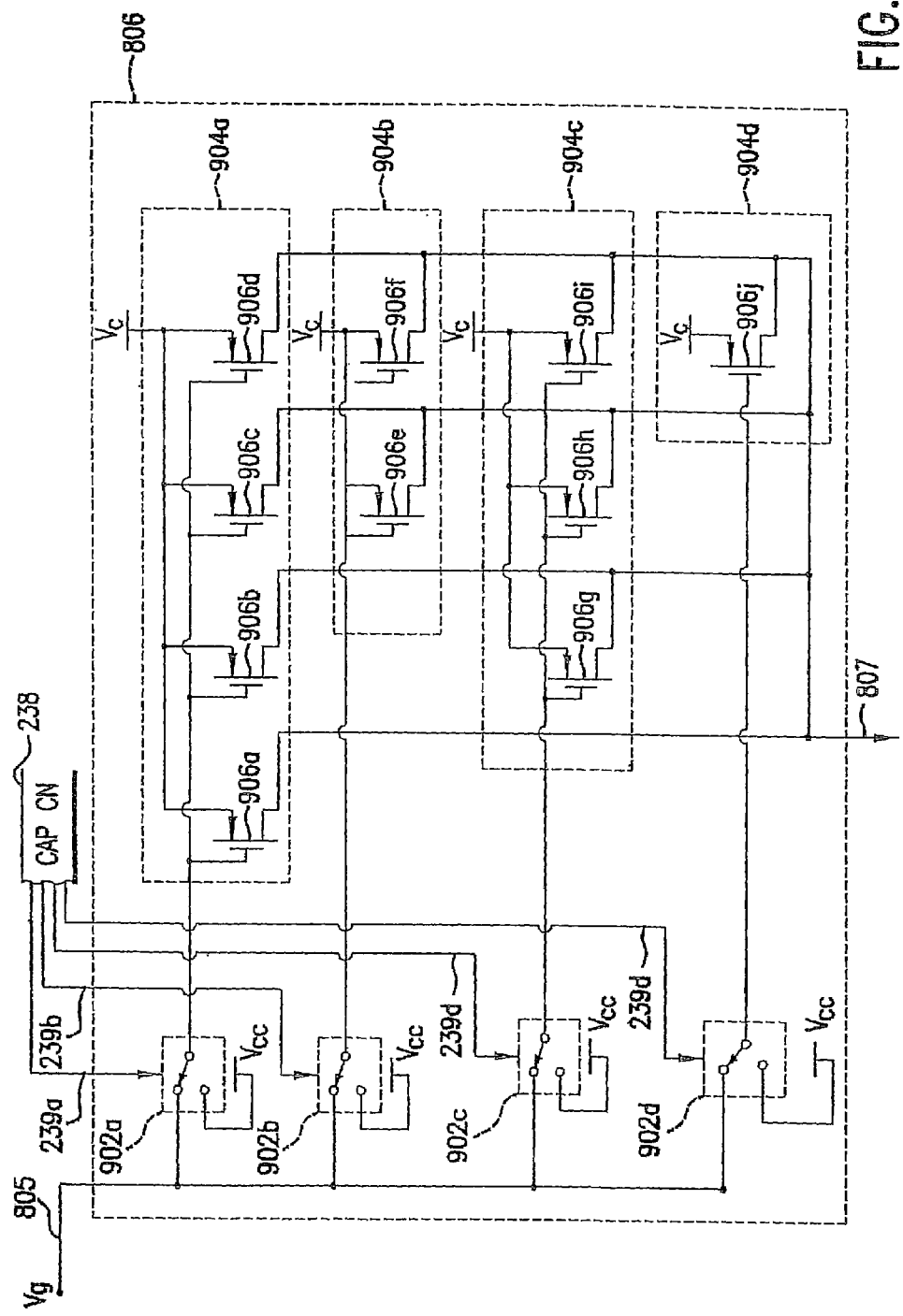

The structure of the gain compensator cell 806 is shown in FIG. 9 and includes: switches 902a-d that are controlled by the respective capacitor control signals 239a-d, and unit current sources 906a-j that are arranged in groups 904a-d. Preferably, each unit current source 906 generates substantially the same amount of unit current (within transistor tolerances), where the amount of unit current is based on a gate voltage 805 that is generated by the voltage generate 801. Each group 904 corresponds to a capacitor 232, and generates a portion of the total pump current 205 when the respective capacitor 232 is switched-in to the LC circuit 228. The number of unit current sources 906 in each group 904 is selected to compensate for the variable VCO gain that occurs when the corresponding capacitor 232 is switched-in to the LC circuit 228. For example, group 904a corresponds to capacitor 232a, and has 4 unit current sources 906 to compensate for variable VCO gain that is caused by the capacitor 232a. Whereas, group 904b only has 2 unit current sources 906 to address the variable VCO gain caused by the capacitor 232b, and so on. Note that the number of current sources 4,2,3,1 that are shown in FIG. 9 for the groups 902a-d are for illustration purposes only, and is not meant to be limiting. Furthermore, the number of groups 904, namely 4 as shown, is not meant to be limiting. In embodiments of the invention, the number of groups 904 should be less than or equal to the number of fixed capacitors 232.

A group 904 is switched into the gain compensator cell 806 when the corresponding switch 902 connects Vg 805 to the unit current sources 906 in the group 904. Once connected to a group 904, the Vg 805 activates the current sources 906 and determines the current produced by each current source 906. The switches 902 are controlled by the same capacitor control signals 239 that switches-in the respective capacitors 232 into the LC circuit 228. Therefore, when a capacitor 232 is switched-in to the LC circuit 228, the corresponding group 904 will be switched-in to the gain compensator cell 806, and therefore contribute to the prospective pump current 807. For instance, if the capacitor 232a is switched-in to the LC circuit 228 by the capacitor control signal 239a, then the group 904a of unit current sources 906 will be switched-in to the gain compensator cell 806 by the same control signal 239a. Therefore, the current from the group 904a will contribute to the prospective pump current 807, and thereby compensate for the variable VCO gain that is caused by the capacitor 232a. If the capacitor 232b is then switched-in to the LC circuit 228, then the group 904b is switched-in to the gain compensator cell 806 to compensate for the variable VCO gain that is caused by the capacitor 232b. As such, the charge pump current 205 is simultaneously adjusted to maintain a flat overall PLL as the capacitors 232 are incrementally added to (or subtracted from) the LC circuit 228.

Each unit current source 906 is preferably a PFET transistor, as shown. However, other transistor devices and configurations could be used for the unit current sources 906; including N-FET transistors, as will be understood by those skilled in the relevant arts based on the discussions given herein. These other transistor devices and configurations are within the scope and spirit of the present invention. For example, simultaneous use of NFET and PFET current sources would permit the gain compensator to compensate for a non-monotonic VCO gain verses fixed capacitance characteristic.

The voltage generator 801 and the current sources 906 operate as a "current mirror", where the drain currents of the selected unit current sources 906 copy or "mirror" a reference scale current 812. More specifically, the current scaler 804 sets the reference scale current 812, which operates as a current sink for the PFET 802. The PFET 802 operates as a diode because the gate and drain of the PFET 802 are shorted together by a conductor 813. The drain current 814 of the PFET 802 is substantially the same as the reference scale current 812 because there is substantially zero current on the conductor 813. The diode-connected PFET 802 generates the gate voltage 805 at its gate terminal to correspond with the drain current 814, and therefore to the reference scale current 812. If the drain current 814 deviates from the reference scale current 812 for some reason, then charge flows to/from the gate of the PFET 802 to bring the current 814 and the scale current 812 back in-line with each other. The gate voltage 805 is applied to the gate of the current sources 906 when their respective group 904 is selected by the capacitor control signals 239. The current sources 906 will reproduce (or "mirror") the drain current 814 due to the common gate voltage 805, if the device characteristics of the current sources 906 are sufficiently similar to those of the PFET 802. This current mirror effect occurs because two or more FETs that have a common gate-to-source voltage and similar device characteristics will generate substantially the same drain current. If a group 904 is not switched-in by the corresponding capacitor control signal 239 (because the corresponding capacitor 232 is not switched in the LC circuit 228), then the gates of the corresponding current sources 906 are connected to Vcc by the corresponding switch 902. When connected to Vcc, these non-selected current sources 906 are cutoff and do not generate a unit current.

Preferably, the PFET 802 and the current sources 906 are fabricated on the same semiconductor wafer using the same process, which improves the commonality of device characteristics. However, if the size of the unit current sources 906 is scaled relative to the size of the PFET 802, then the unit current sources 906 will generate a current that is proportional to the scale factor, as will be understood by those skilled in the relevant arts. This increases the flexibility of the gain compensator cell 806, as the current sources 906 can be scaled relative to the PFET 802 as well as relative to each other.

The current scaler 804 sets the reference scale current 812 based on a PLL control signal 810, where the PLL control signal 810 dictates various PLL characteristics such as the frequency of the reference signal 201, the PLL loop bandwidth, and PLL loop damping, etc. FIG. 10 illustrates one embodiment of the current scaler 804 and includes weighted current sources 1002a-n. The weighted current sources 1002a-n sink currents 1004a-n based the PLL variables in the PLL control signal 810. For example, the current source 1002a can be adapted to generate a current 1004a that is proportional to the frequency of the reference signal 201, and the current source 1002b can be adapted to generate a current 1004b that is proportional to the desired loop bandwidth, etc. The currents 1004a-n are summed together to form the reference scale current 812 that feeds the diode-connected PFET 802. Therefore, changes in the PLL variables are reflected in the reference scale current 812, and ultimately in the drain currents of the unit current sources 906 because of the current mirror effect described herein. More specifically, the PFET drain current 814 is substantially the same as the reference scale current 812, and gets copied to the drain currents of the unit current sources 906.

An advantage of using the current scaler 800 is that all of the current sources 906 (that are in a selected group 904) are simultaneously adjusted for changing PLL characteristics, in addition to compensating for variable VCO gain. Therefore, the prospective pump current 807 (and ultimately the final pump current 205) can be efficiently tuned to compensate for changing PLL characteristics. This allows the same PLL to be utilized under different operating conditions. Furthermore, the current scaler 804 reduces the size of the overall gain compensator because multiple sets of current sources 906 are not needed to address changing PLL characteristics. In contrast, the ROMDAC 700 requires multiple sets 710 of current values to address changing PLL characteristics, which increases the size of the ROMDAC 700.

The following examples illustrate the flexibility of the PLL 500 when using the current scaler 804 to adjust for changing PLL characteristics (besides VCO gain). In a first example, the frequency of the reference signal 201 increases by a factor of two, but the frequency divider 206 ratio is to remain constant. The same the frequency divider 206 can be used in the PLL 500 if the charge pump current 205 is reduced by approximately a factor of two. This is accomplished by reducing the reference scale current 812 that is generated by the current scaler 804, causing a corresponding reduction in the gate voltage 805. Through the current mirror effect, the current produced by the selected current sources 906 will be proportionally reduced by a factor of two. Therefore, the prospective current 807 (and the pump 205) will also be reduced by a factor of two as desired, and the same PLL 500 can be reused for the new reference frequency.

In a second example, the PLL damping factor $\zeta$ is to be increased, but the PLL bandwidth is to be held constant. The PLL damping factor $\zeta$ is increased by increasing the resistance of the variable resistor 210 in the loop filter 208. However, this also changes the loop bandwidth as will be understood by those skilled in the arts. To compensate, the current scaler 804 adjusts the reference scale current 812, and therefore the unit current sources 906 to produce a reference pump current 205 that compensates for the loop bandwidth.

In summary, and based on the examples herein, the gain compensator 800 is able to compensate for variable VCO gain and simultaneously tune other PLL characteristics by using the current mirror configuration described herein. These other PLL characteristics include but are not limited to changes in reference frequency, damping factor, and bandwidth.

The flowchart 1100 further describes the operation of the gain compensator 800 and VCO gain compensation according to embodiments of the present invention. The order of the steps in the flowchart 1100 is not limiting as all or some of the steps can be performed simultaneously or in a different order, as will be understood by those skilled in the arts.

In step 1102, a VCO 226 is selected from the VCO 226a-c based on the desired frequency of the output signal 227. The selection is made by closing the appropriate switch 230 using the control signals 239 to switch-in the desired VCO 226.

In step 1104, the VCO output signal 227 is fed back to the phase detector 202 through a frequency divider 206. The frequency divider 206 normalizes the frequency of the output signal 227 to that of the reference signal 201 for comparison in the phase detector 202.

In step 1106, the phase detector 202 compares the phase of the output signal 227 to the reference signal 201, and generates a DC error signal 203 that represents the phase difference between the two signals.

In step 1108, the charge pump 204 sources or sinks a percentage of a reference pump current 205 based the error signal 203.

In step 1110, the output current from the charge pump 204 drives the loop filter 208 to produce a tuning voltage 209.

In step 1112, one or more fixed capacitors 232 are switched-in to (or switched-out of) the LC resonant circuit 228 based on the tuning voltage 209, to perform coarse frequency tuning of the selected VCO 226. The fixed capacitors 232 perform coarse frequency tuning by shifting the resonant frequency of the LC circuit 228, and therefore the selected VCO 226. The fixed capacitors 232 are switched-in to (or switched-out of) the LC circuit 228 by switching the corresponding switches 230 using the control signals 239.

In step 1114, the gain compensator 800 adjusts the charge pump reference current 205 to compensate for variable VCO gain that is caused by adding or subtracting the fixed capacitors 232. The reference current 205 is adjusted based on the VCO control signals 239 and also the capacitor control signals 239. In embodiments, the reference current 205 is adjusted simultaneously with the switching of the fixed capacitors 232 by the capacitor control signals 239.

In step 1116, the tuning voltage 209 fine tunes the frequency of the selected VCO 226 by changing voltage across the varactor 234. The VCO gain vs. fixed capacitance is substantially linearized by the gain compensator 800 in step 1114, thereby flattening the PLL gain and improving the PLL spectral purity.

Flowchart 1200 further describes step 1114, where the gain compensator 800 adjusts the charge pump current to compensate for variable VCO gain. The order of the steps in the flowchart 1200 is not limiting as all or some of the steps can be performed simultaneously or in a different order, as will be understood by those skilled in the arts.

In step 1202, the gain compensator 800 receives the VCO control signals 239 and the capacitor control signals 239. The VCO control signals 239 determine which VCO 226 is switched-in to the PLL 500. The capacitor control signals 239 determine which fixed capacitors 232 are switched-in to the LC circuit 228.

In step 1204, a gain compensator cell 806 is selected to correspond to the VCO 226 that is switched-in to the PLL 500, as indicated by the VCO control signals 239. More specifically, the control signals 239 turn-on the appropriate P-FET 808 for the gain compensator cell 806 that corresponds to the selected VCO 226.

In step 1206, the current scaler 804 generates a reference scale current 812 that is based on a PLL control signal 810, where the PLL control signal 810 defines certain PLL characteristics including reference frequency, loop bandwidth, and damping factor.

In step 1208, the switches 902 activate one or more groups 904 of unit current sources 906 according to the capacitor control signals 239. The groups 904 that are activated correspond to the capacitors 232 that are switched-in to the LC circuit 228, as indicated by the capacitor control signals 239. The remaining (non-selected) current sources 906 are cutoff.

In step 1210, the activated groups 904 replicate (or copy) the reference scale current 812 one or more times, where the number of times that the reference scale current 812 is replicated is dependent on the capacitors 232 that are switched-in to the LC circuit 228. More specifically, the activated groups 904 replicate the reference scale current enough times to sufficiently compensate the variable VCO gain that is caused by the corresponding capacitors 232.

In step 1212, the currents from the activated current sources 906 are added together to generate the charge pump reference current 205.

In step 1214, the current scaler 804 adjusts the reference scale current 812 to address changing PLL characteristics, such as reference frequency, loop bandwidth, and damping factor. By adjusting the reference scale current 812, all of the replicated currents in step 1210 are simultaneously adjusted to address the changing PLL characteristics.

5. Other Applications

The gain compensation invention described herein has been discussed in reference to a tuner application. However, the gain compensation invention is not limited to tuners, and is applicable to other non-tuner applications that can benefit from flat PLL gain. Additionally, the gain compensation invention is applicable to other non-PLL circuits that can benefit from compensating for variable VCO gain. The application of the gain compensation invention to these non-PLL circuits will be understood by those skilled in the relevant arts based on the discussions given herein, and are within the scope and spirit of the present invention.

6. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

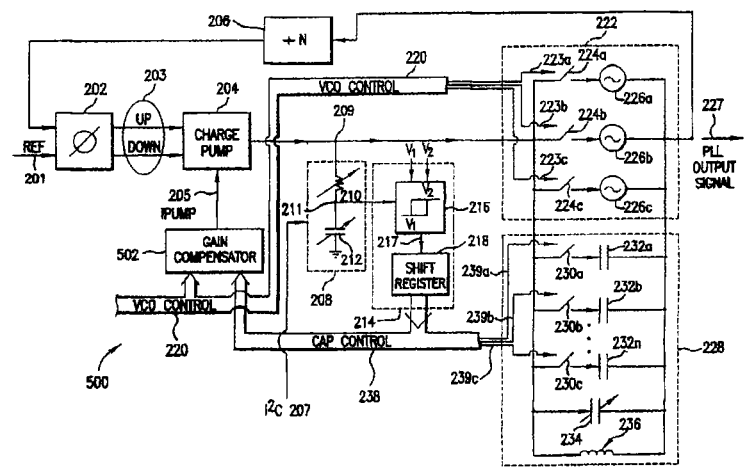

What is claimed is:

1. A method of adjusting a signal frequency in a radio frequency (RF) device, comprising:
    selecting an oscillator from a plurality of oscillators, the plurality of oscillators being operatively coupled to a loop filter;
    inputting a first signal that is a function of a reference signal;
    inputting a second signal that is a function of a signal of the selected oscillator;
    comparing the first signal and the second signal;
    selectively adding or removing capacitance to an LC circuit that is operatively coupled to the selected oscillator; and
    selectively activating a group of a plurality of groups of current sources within a gain cell associated with the selectively added or removed capacitance, the selectively activated group contributing to a charge pump current.

2. The method according to claim 1, wherein the LC circuit comprises capacitors in a parallel circuit configuration.

3. The method according to claim 2,
    wherein the capacitors are operatively coupled to switches, each capacitor being operatively coupled to a respective switch, and wherein the respective switch switches the corresponding capacitor into or out of the LC circuit.

4. The method according to claim 3, comprising:
digitally controlling the switches.

5. The method according to claim 1,
wherein the selected oscillator comprises a first transistor and a second transistor,
wherein an output of the first transistor is operatively coupled to an input of the second transistor, and
wherein an output of the second transistor is operatively coupled to an input of the first transistor.

6. The method according to claim 5,
wherein the LC circuit comprises a first diode and a second diode, and
wherein the first diode and the second diode are in a series circuit configuration, and
wherein the first diode and the second diode are operatively coupled between the output of the first transistor and the output of the second transistor.

7. The method according to claim 6,
wherein the first diode comprises a first varactor diode, and
wherein the second diode comprises a second varactor diode.

8. The method according to claim 7, wherein the first diode and the second diode are operatively coupled such that a forward-bias current path of the first diode is opposite in direction to a forward-bias current path of the second diode.

9. The method according to claim 1, wherein the selected oscillator is part of a phase lock loop (PLL) circuit.

10. The method according to claim 9, comprising:
selecting the gain cell of a plurality of gain cells, the selected gain cell being associated with the selected oscillator, the selected gain cell contributing to the charge pump current.

11. The method according to claim 9, wherein the PLL circuit comprises a window comparator.

12. The method according to claim 9, wherein the PLL circuit comprises a frequency divider, a phase detector, a charge pump, a loop filter and the selected oscillator.

13. The method according to claim 12,
wherein the frequency divider is operatively coupled to the phase detector,
wherein the phase detector is operatively coupled to the charge pump,
wherein the charge pump is operatively coupled to the loop filter,
wherein the loop filter is operatively coupled to the selected oscillator, and
wherein the selected oscillator is operatively coupled to the frequency divider.

14. The method according to claim 9, comprising:
attempting to keep a gain of the PLL circuit flat for variations in switched capacitance.

15. The method according to claim 9, comprising:
attempting to keep a gain of the PLL circuit flat for variations in gain of the selected oscillator.

16. The method according to claim 9, comprising:
attempting to keep a gain of the PLL circuit flat for variations in operating conditions of the selected oscillator.

17. The method according to claim 1, comprising:
adjusting a frequency of the signal of the selected oscillator as a function of the selectively added or removed capacitance.

18. The method according to claim 1, wherein the selected oscillator is used in a PLL circuit that is used in or with an RF receiver.

19. The method according to claim 18, wherein the PLL circuit is used to provide a downconversion signal to a mixer of the RF receiver.

20. The method according to claim 18, wherein the PLL circuit is used to provide an upconversion signal to a mixer of the RF receiver.

* * * * *

UNITED STATES PATENT AND TRADEMARK OFFICE
CERTIFICATE OF CORRECTION

| | | |
|---|---|---|
| PATENT NO. | : 7,449,963 B2 | |
| APPLICATION NO. | : 11/754804 | |
| DATED | : November 11, 2008 | |
| INVENTOR(S) | : Ramon A. Gomez | |

It is certified that error appears in the above-identified patent and that said Letters Patent is hereby corrected as shown below:

Column 15, line 12 delete "claim 5" and insert -- claim 21 --.

Column 15, line 18 delete "the output of".

Column 15, lines 18-19, delete "the output of".

Column 16, insert after line 37 the following:

-- 21. The method according to claim 1,
wherein the selected oscillator comprises a first transistor and a second transistor, and
wherein the first transistor and the second transistor are cross coupled.

22. The method according to claim 21, wherein the LC circuit comprises a particular capacitance that is operatively coupled between differential outputs of the selected oscillator.

23. The method according to claim 22, wherein the particular capacitance comprises one or more varactors.

24. The method according to claim 23, wherein the one or more varactors are in series.

25. The method according to claim 2, wherein the capacitors comprise one or more varactors.

26. The method according to claim 25,
wherein the one or more varactors are operatively coupled to receive a control signal, and
wherein the control signal determines a capacitance of the one or more varactors.

Signed and Sealed this
Thirty-first Day of January, 2012

David J. Kappos
*Director of the United States Patent and Trademark Office*

27. The method according to claim 18, wherein the PLL circuit is used to provide a local oscillator signal of the RF device. --

UNITED STATES PATENT AND TRADEMARK OFFICE
CERTIFICATE OF CORRECTION

PATENT NO.        : 7,449,963 B2
APPLICATION NO.   : 11/754804
DATED             : November 11, 2008
INVENTOR(S)       : Ramon A. Gomez It is certified that error appears in the above-identified patent and that said Letters Patent is hereby corrected as shown below:

Delete the title page and substitute therefore the attached title page showing the corrected number of claims in patent.

Column 15, line 12 delete "claim 5" and insert -- claim 21 --.

Column 15, line 18 delete "the output of".

Column 15, lines 18-19, delete "the output of".

Column 16, insert after line 37 the following:

-- 21.  The method according to claim 1, wherein the selected oscillator comprises a first transistor and a second transistor, and wherein the first transistor and the second transistor are cross coupled.

22.  The method according to claim 21, wherein the LC circuit comprises a particular capacitance that is operatively coupled between differential outputs of the selected oscillator.

23.  The method according to claim 22, wherein the particular capacitance comprises one or more varactors.

24.  The method according to claim 23, wherein the one or more varactors are in series.

25.  The method according to claim 2, wherein the capacitors comprise one or more varactors.

This certificate supersedes the Certificate of Correction issued January 31, 2012.

Signed and Sealed this
Twenty-first Day of February, 2012

David J. Kappos
*Director of the United States Patent and Trademark Office*

26. The method according to claim 25,
wherein the one or more varactors are operatively coupled to receive a control signal, and
wherein the control signal determines a capacitance of the one or more varactors.

27. The method according to claim 18, wherein the PLL circuit is used to provide a local oscillator signal of the RF device. --

(12) United States Patent
Gomez

(10) Patent No.: US 7,449,963 B2
(45) Date of Patent: *Nov. 11, 2008

(54) APPARATUS AND METHOD FOR PHASE LOCK GAIN CONTROL USING UNIT CURRENT SOURCES

(75) Inventor: Ramon A. Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 11/754,804

(22) Filed: May 29, 2007

(65) Prior Publication Data
US 2007/0268076 A1 Nov. 22, 2007

Related U.S. Application Data

(63) Continuation of application No. 11/314,618, filed on Dec. 21, 2005, now Pat. No. 7,224,234, which is a continuation of application No. 11/096,154, filed on Mar. 30, 2005, now Pat. No. 7,119,624, which is a continuation of application No. 11/019,451, filed on Dec. 23, 2004, now Pat. No. 7,129,792, which is a continuation of application No. 10/443,741, filed on May 23, 2003, now Pat. No. 6,838,947, which is a continuation of application No. 09/811,611, filed on Mar. 20, 2001, now Pat. No. 6,583,675, said application No. 11/314,618 is a continuation of application No. 11/019,451, filed on Dec. 23, 2004, now Pat. No. 7,129,792, which is a continuation of application No. 10/443,741, filed on May 23, 2003, now Pat. No. 6,838,947, which is a continuation of application No. 09/811,611, filed on Mar. 20, 2001, now Pat. No. 6,583,675.

(51) Int. Cl.
*H03L 7/00* (2006.01)

(52) U.S. Cl. .................................. 331/17; 331/16

(58) Field of Classification Search .................. 331/2, 331/16, 17, 117 R
See application file for complete search history.

(56) References Cited

U.S. PATENT DOCUMENTS 3,526,859 A 9/1970 Putzer (Continued)

FOREIGN PATENT DOCUMENTS

| EP | 0627820 | 12/1994 |
|----|---------|---------|
| EP | 0642227 | 3/1995 |
| EP | 1075086 | 2/2001 |

OTHER PUBLICATIONS

Crawford, J.A., "Frequency Synthesizer Design Handbook," Artech House, pp. 248-254 and 292-304 (1994).

(Continued)

*Primary Examiner*—Joseph Chang
(74) *Attorney, Agent, or Firm*—McAndrews, Held & Malloy, Ltd.

(57) ABSTRACT

A gain compensator compensates for the gain variation of a varactor-tuned voltage tuned oscillator (VCO) in a phase lock loop (PLL). The VCO includes a parallel LC circuit having multiple fixed capacitors that can be switched-in or switched-out of the LC circuit according to a capacitor control signal to perform band-select tuning of the VCO. The gain compensator compensates for the variable VCO gain by generating a charge pump reference current that is based on the same capacitor control signal that controls the fixed capacitors in the LC circuit. The gain compensator generates the charge pump reference current by replicating a reference scale current using unit current sources. The number of times the reference scale current is replicated is based on the fixed capacitance that is switched-in to the LC circuit and therefore the frequency band of the PLL. The reference scale current is generated based on a PLL control that specifies certain PLL characteristics such as reference frequency, loop bandwidth, and loop damping. Therefore, the reference pump current can be efficiently optimized for-changing PLL operating conditions, in addition to compensating for variable VCO gain.

27 Claims, 13 Drawing Sheets